(12) United States Patent
Ishida et al.

(10) Patent No.: US 12,255,604 B2
(45) Date of Patent: Mar. 18, 2025

(54) ACOUSTIC WAVE DEVICE AND FILTER

(71) Applicant: TAIYO YUDEN CO., LTD., Tokyo (JP)

(72) Inventors: Mamoru Ishida, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 717 days.

(21) Appl. No.: 17/199,349

(22) Filed: Mar. 11, 2021

(65) Prior Publication Data
US 2021/0297055 A1 Sep. 23, 2021

(30) Foreign Application Priority Data

Mar. 17, 2020 (JP) ................................. 2020-046698

(51) Int. Cl.
*H03H 9/02* (2006.01)
*H03H 9/13* (2006.01)
(Continued)

(52) U.S. Cl.
CPC .... *H03H 9/02086* (2013.01); *H03H 9/02031* (2013.01); *H03H 9/13* (2013.01);
(Continued)

(58) Field of Classification Search
CPC .. H03H 9/02086; H03H 9/02031; H03H 9/13; H03H 9/173; H03H 9/175;
(Continued)

(56) References Cited

U.S. PATENT DOCUMENTS

| 10,367,472 B2 * | 7/2019 | Burak ................ H10N 30/871 |
| 2004/0017269 A1 | 1/2004 | Gotoh et al. |

(Continued)

FOREIGN PATENT DOCUMENTS

| JP | 2004-072715 A | 3/2004 |
| JP | 2004-112757 A | 4/2004 |

(Continued)

OTHER PUBLICATIONS

Chinese Office Action dated Jan. 12, 2024 in a counterpart Chinese patent application No. 202110276305.5. (A machine translation (not reviewed for accuracy) attached.).

(Continued)

*Primary Examiner* — Jorge L Salazar, Jr.
(74) *Attorney, Agent, or Firm* — CHEN YOSHIMURA LLP

(57) ABSTRACT

An acoustic wave device includes a piezoelectric layer, the piezoelectric layer being a rotated Y-cut lithium niobate substrate or an X-cut lithium tantalate substrate; an upper conductive layer having a substantially consistent density, on or over the upper surface of the piezoelectric layer; a lower conductive layer having a substantially consistent density, on or below the lower surface of the piezoelectric layer; and a first additional film having a substantially consistent density, wherein at least one of the upper and lower conductive layers is mainly made of ruthenium, chrome, copper, molybdenum, tungsten, tantalum, platinum, rhodium, or iridium, and wherein at least a part of the first additional film is in the resonance region in the plan view, and the density of the first additional film is equal to or less than the density of aluminum.

17 Claims, 17 Drawing Sheets

(51) Int. Cl.
*H03H 9/17* (2006.01)
*H03H 9/56* (2006.01)
*H03H 9/70* (2006.01)

(52) U.S. Cl.
CPC ............ *H03H 9/173* (2013.01); *H03H 9/175* (2013.01); *H03H 9/176* (2013.01); *H03H 9/562* (2013.01); *H03H 9/564* (2013.01); *H03H 9/568* (2013.01); *H03H 9/706* (2013.01)

(58) Field of Classification Search
CPC ........ H03H 9/176; H03H 9/562; H03H 9/564; H03H 9/568; H03H 9/706; H03H 9/02015; H03H 9/02102; H03H 9/02118; H03H 9/64; H03H 9/145
USPC .......................................... 333/133, 187, 188
See application file for complete search history.

(56) References Cited

U.S. PATENT DOCUMENTS

| | | |
|---|---|---|
| 2004/0140868 A1 | 7/2004 | Takeuchi et al. |
| 2007/0152775 A1 | 7/2007 | Fujii et al. |
| 2007/0210878 A1 | 9/2007 | Yamaguchi et al. |
| 2008/0129411 A1* | 6/2008 | Beaudin .................... H03F 3/60 333/133 |
| 2011/0227451 A1 | 9/2011 | Yamazaki |
| 2013/0033337 A1 | 2/2013 | Nishihara et al. |
| 2016/0164490 A1 | 6/2016 | Kamijo et al. |
| 2020/0169245 A1 | 5/2020 | Matsuda et al. |

FOREIGN PATENT DOCUMENTS

| | | |
|---|---|---|
| JP | 2007-166148 A | 6/2007 |
| JP | 2007-312157 A | 11/2007 |
| JP | 2008-42871 A | 2/2008 |
| JP | 2008-306280 A | 12/2008 |
| JP | 2013-038471 A | 2/2013 |
| JP | 2020-88680 A | 6/2020 |
| WO | 2006/027873 A1 | 3/2006 |
| WO | 2013/031748 A1 | 3/2013 |

OTHER PUBLICATIONS

Japanese Office Action dated Nov. 14, 2023 in a counterpart Japanese patent application No. 2020-046698. (A machine translation (not reviewed for accuracy) attached.).

* cited by examiner

ACOUSTIC WAVE DEVICE AND FILTER

FIELD

A certain aspect of the present disclosure relates to an acoustic wave device and a filter.

BACKGROUND

Bulk acoustic wave (BAW) resonators such as film bulk acoustic resonators (FBARs) and solid mounted resonators (SMRs) have been used as filters and duplexers for high-frequency circuits of wireless terminals such as mobile phones. The BAW resonator is called a piezoelectric thin film resonator. The piezoelectric thin film resonator has a structure designed to have a pair of electrodes with a piezoelectric film interposed therebetween, and the resonance region where the pair of electrodes are opposite to each other across at least a part of the piezoelectric film is the region where the acoustic wave resonates.

In the piezoelectric thin film resonator, when the acoustic wave is reflected in the peripheral part of the resonance region and a standing wave is thereby formed within the resonance region, unnecessary spurious emissions are generated.

Therefore, it is known to reduce spurious emissions by adding an additional film in the edge region within the resonance region to control the acoustic velocity as disclosed in, for example, Japanese Patent Application Publication No. 2008-42871.

SUMMARY OF THE INVENTION

When a monocrystalline piezoelectric substance such as lithium tantalate, lithium niobate, or crystalline quartz is used for the piezoelectric film, the vibration within the resonance region becomes thickness-shear vibration. The acoustic wave device using the thickness-shear vibration has a large electromechanical coupling coefficient.

However, when a resonator is used for a filter, it is required to adjust the electromechanical coupling coefficient without largely deteriorating the resonance characteristics.

In one aspect, the present disclosure provides an acoustic wave device comprising: a piezoelectric layer having an upper surface and a lower surface, the piezoelectric layer being a rotated Y-cut lithium niobate substrate or an X-cut lithium tantalate substrate; an upper conductive layer having a substantially consistent density, on or over the upper surface of the piezoelectric layer; a lower conductive layer having a substantially consistent density, on or below the lower surface of the piezoelectric layer, a region where the upper conductive layer faces the lower conductive layer across the piezoelectric layer in a plan view defining a resonance region; and a first additional film having a substantially consistent density, disposed in at least one of the following locations: between the upper conductive layer and the piezoelectric layer, between the lower conductive layer and the piezoelectric layer, on an upper surface of the upper conductive layer, within the upper conductive layer as inserted therein, on a lower surface of the lower conductive layer, and within the lower conductive layer as inserted therein, wherein at least one of the upper and lower conductive layers is mainly made of ruthenium, chrome, copper, molybdenum, tungsten, tantalum, platinum, rhodium, or iridium, and wherein at least a part of the first additional film is in the resonance region in the plan view, and the density of the first additional film is equal to or less than the density of aluminum.

In another aspect of the present disclosure, there is provided an acoustic wave device comprising: a piezoelectric layer having an upper surface and a lower surface, the piezoelectric layer being a rotated Y-cut lithium niobate substrate or an X-cut lithium tantalate substrate; an upper conductive layer having a substantially consistent density, on or over the upper surface of the piezoelectric layer; a lower conductive layer having a substantially consistent density, on or below the lower surface of the piezoelectric layer, a region where the upper conductive layer faces the lower conductive layer across the piezoelectric layer in a plan view defining a resonance region, at least one of the upper and lower conductive layers being mainly made of aluminum; and a first additional film having a substantially consistent density, disposed in at least one of the following locations: between the upper conductive layer and the piezoelectric layer, between the lower conductive layer and the piezoelectric layer, on an upper surface of the upper conductive layer, within the upper conductive layer as inserted therein, on a lower surface of the lower conductive layer, and within the lower conductive layer as inserted therein, wherein at least a part of the first additional film is in the resonance region in the plan view, and the first additional film is mainly made of silicon oxide.

In the above acoustic wave device, the first additional film may be an insulating film having a relative permittivity less than a relative permittivity of the piezoelectric layer.

In the above acoustic wave device, the piezoelectric layer may be a rotated Y-cut lithium niobate substrate.

In the above acoustic wave device, the piezoelectric layer may be an X-cut lithium tantalate substrate.

The above acoustic wave device may further include a second additional film, and when one of the pair of first electrodes is viewed in a plan view, the second additional film may be not disposed in a center region including a center of gravity of the first resonance region, and at least a part of the second additional film may be disposed in each of edge regions being other than the center region in the first resonance region and sandwiching the center region therebetween.

In the above acoustic wave device, the first additional film may be formed of a single film, or a plurality of films located away from each other, and a thickness of the single film and a total thickness of the plurality of films are greater than 0 and is equal to or less than 0.18 times a thickness of the piezoelectric layer.

In another aspect of the present disclosure, there is provided a filter including: a first resonator including the above acoustic wave device, and a frequency adjusting film having a density greater than that of the first additional film in the first resonance region of the above acoustic wave device; and a second resonator including a pair of second electrodes sandwiching a piezoelectric layer therebetween and exciting thickness-shear vibration in the piezoelectric layer, no additional film and no frequency adjusting film being disposed in any of the following locations: between the upper conductive layer and the piezoelectric layer, between the lower conductive layer and the piezoelectric layer, on an upper surface of the upper conductive layer, within the upper conductive layer, on a lower surface of the lower conductive layer, and within the lower conductive layer.

In another aspect of the present disclosure, there is provided a filter including: a first resonator including the above acoustic wave device; and a second resonator including the above acoustic wave device, wherein the first additional film of the first resonator is provided singly or in a plurality, and the first additional film of the second resonator is provided singly or in a plurality, wherein a total thickness of the first additional film of the second resonator is less than a total thickness of the first additional film of the first resonator.

The above filter may further include an input terminal; an output terminal; one or more series resonators provided in a path connecting the input terminal to the output terminal, each of the one or more series resonators being the first resonator; and a parallel resonator having a first end that is connected to the path and a second end that is grounded, the parallel resonator being the second resonator.

In another aspect of the present disclosure, there is provided an acoustic wave device including: a piezoelectric layer that is an X-cut lithium tantalate substrate or a rotated Y-cut lithium niobate substrate, the piezoelectric layer having an upper surface and a lower surface; an upper conductive layer on or over the upper surface of the piezoelectric layer; a lower conductive layer on or below the lower surface of the piezoelectric layer, a region where the upper conductive layer faces the lower conductive layer across the piezoelectric layer in a plan view defining a resonance region, the upper conductive layer and the lower conductive layer exciting thickness-shear vibration in the piezoelectric layer, at least one of the upper conductive layer or the lower conductive layer including a single metal film or a plurality of metal films, the single metal film and each of the plurality of metal films being mainly made of ruthenium, chrome, copper, molybdenum, tungsten, tantalum, platinum, rhodium, or iridium; and a first additional film having a substantially consistent density, disposed in at least one of the following locations: between the upper conductive layer and the piezoelectric layer, between the lower conductive layer and the piezoelectric layer, on an upper surface of the upper conductive layer, within the upper conductive layer as inserted therein, on a lower surface of the lower conductive layer, and within the lower conductive layer as inserted therein, wherein at least a part of the first additional film is in the resonance region in the plan view, and the density of the first additional film is equal to or smaller than the density of aluminum.

DETAILED DESCRIPTION

Hereinafter, a description will be given of embodiments of the present disclosure with reference to the accompanying drawings.

First Embodiment

A piezoelectric thin film resonator will be described as an example of the acoustic wave device.

Figure 1A:
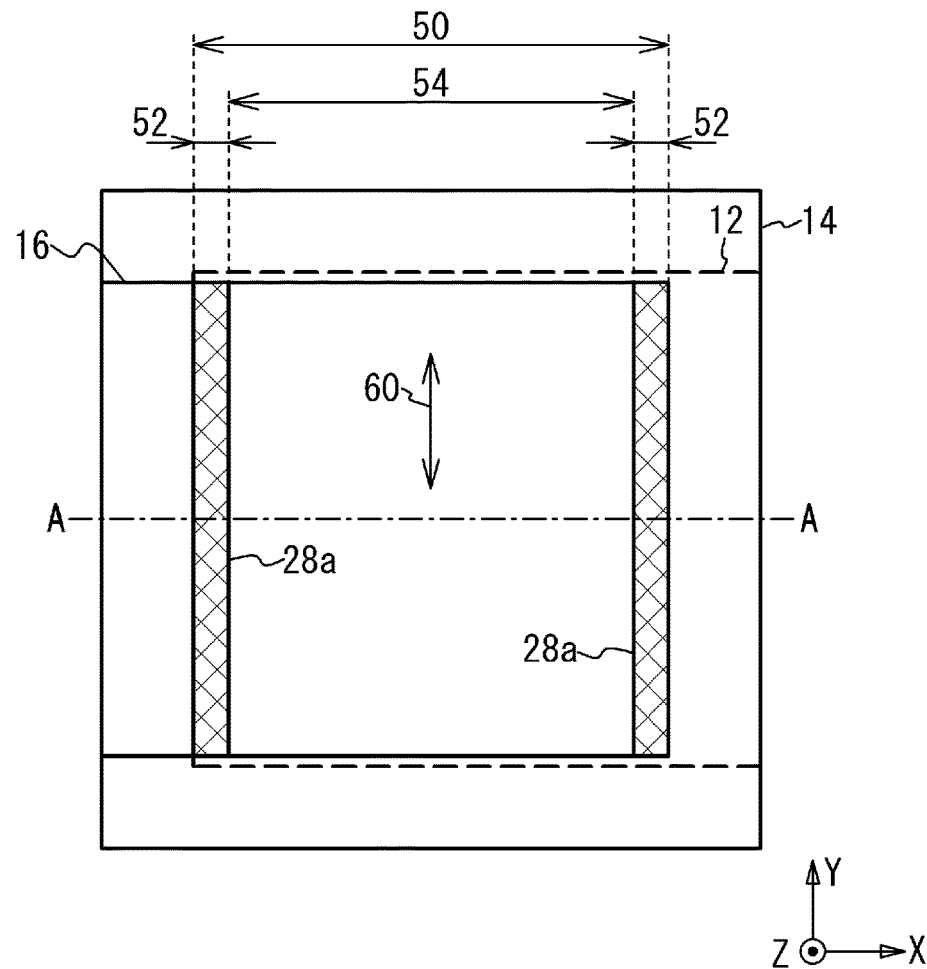
FIG. 1A is a plan view of a piezoelectric thin film resonator in accordance with a first embodiment.
Figure 1B:
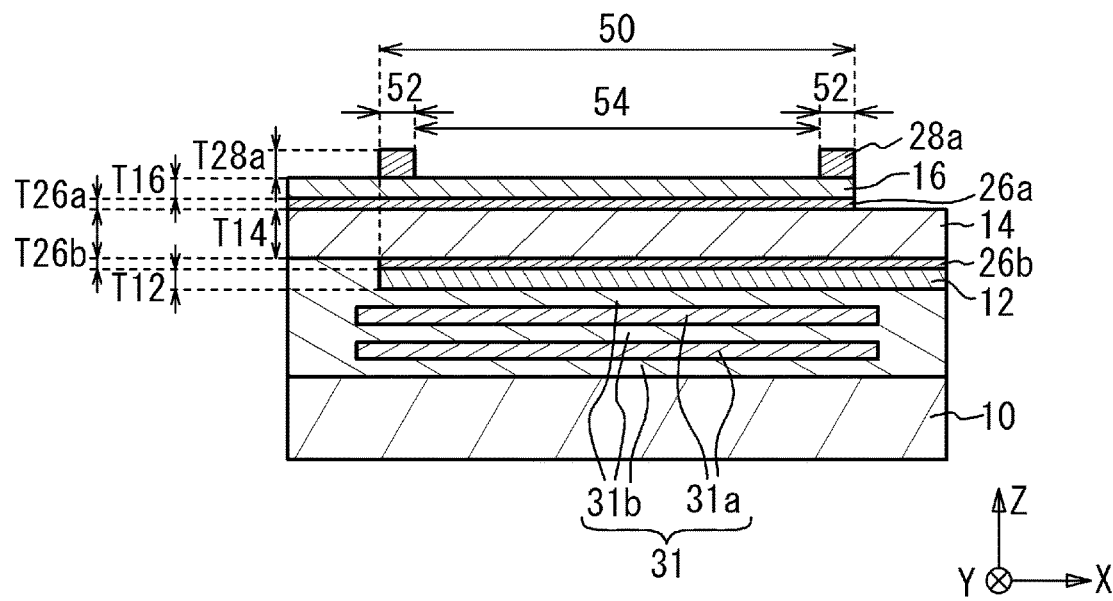
FIG. 1B is a cross-sectional view taken along line A-A in FIG. 1A.

FIG. 1A is a plan view of a piezoelectric thin film resonator in accordance with a first embodiment, and FIG. 1B is a cross-sectional view taken along line A-A in FIG. 1A. In FIG. 1B, an additional film 28a is indicated by cross-hatching. As illustrated in FIG. 1A and FIG. 1B, an acoustic mirror 31 is located on a substrate 10, and a piezoelectric layer 14 is located over the acoustic mirror 31. The upper surface and the lower surface of the piezoelectric layer 14 are substantially flat. An upper electrode 16 is located above the upper surface of the piezoelectric layer 14, and a lower electrode 12 is located below the lower surface of the piezoelectric layer 14. The region where the lower electrode 12 and the upper electrode 16 overlap in a plan view with at least a part of the piezoelectric layer 14 interposed therebetween is a resonance region 50. In the resonance region 50, an additional film 26b is interposed between the piezoelectric layer 14 and the lower electrode 12, while an additional film 26a is interposed between the piezoelectric layer 14 and the upper electrode 16.

When high frequency power is applied between the lower electrode 12 and the upper electrode 16, the acoustic wave of which the displacement vibrates in the direction substantially perpendicular to the Z direction (i.e., the distortion direction with respect to the thickness) is excited in the piezoelectric layer 14 within the resonance region 50. This vibration is called thickness-shear vibration. The direction in which the displacement of the thickness-shear vibration is largest (the displacement direction of the thickness-shear vibration) is defined as a thickness-shear vibration direction 60. The Y direction is defined as the thickness-shear vibration direction 60. The wavelength of the acoustic wave is approximately two times the thickness of the piezoelectric layer 14. The planar shape of the resonance region 50 is substantially rectangular. The rectangle has four sides that are substantially straight. The extension directions of the four sides are the X direction and the Y direction.

Edge regions 52 are located on both sides of a center region 54 of the resonance region 50 in the X direction. The edge regions 52 extend substantially in the Y direction. The width of the edge region 52 in the X direction is substantially uniform along the Y direction. The additional film 28a is disposed on the upper electrode 16 in each of the edge regions 52. In the resonance region 50, no additional film 28a is disposed in the center region 54 sandwiched between the edge regions 52.

The thickness of the additional film 28a is represented by T28a, the thickness of the upper electrode 16 is represented by T16, the thickness of the additional film 26a is represented by T26a, the thickness of the piezoelectric layer 14 is represented by T14, the thickness of the additional film 26b is represented by T26b, and the thickness of the lower electrode 12 is represented by T12.

The acoustic mirror 31 has a structure in which films 31b having low acoustic impedance and films 31a having high acoustic impedance are alternately stacked. The film thickness of each of the films 31a and 31b is, for example, approximately λ/4 (λ is the wavelength of the acoustic wave). Therefore, the acoustic mirror 31 reflects the acoustic wave. The number of the films 31a and the films 31b that are stacked is freely selected. At least, the acoustic mirror 31 has a structure in which two layers having different acoustic characteristics are stacked at intervals. The substrate 10 may be one of the two layers having different acoustic characteristics of the acoustic mirror 31. For example, the acoustic mirror 31 may have a structure in which a single film having acoustic impedance different from that of the substrate 10 is disposed in the substrate 10. In a plan view, the acoustic mirror 31 overlaps with the resonance region 50, and the size of the acoustic mirror 31 is identical to the size of the resonance region 50 or larger than the size of the resonance region 50.

The substrate 10 is, for example, a silicon substrate, a sapphire substrate, an alumina substrate, a spinel substrate, a quartz substrate, a crystalline quartz substrate, a glass substrate, a ceramic substrate, or a GaAs substrate. The lower electrode 12 and the upper electrode 16 are formed of a single-layer film of, for example, ruthenium (Ru), chrome (Cr), aluminum (Al), copper (Cu), molybdenum (Mo), tungsten (W), tantalum (Ta), platinum (Pt), rhodium (Rh) or iridium (Ir), or a multilayered film thereof. The single layer of the upper/lower electrode or any single layer in the multilayered film constituting the upper/lower electrode corresponds to an upper/lower conductive layer having a substantially consistent density. The additional film 28a may be a metal film exemplified in the lower electrode 12 and the upper electrode 16, or an insulating film such as a silicon oxide film, a silicon nitride film, an aluminum oxide film, a tantalum oxide film, or a niobium oxide film. The material of the additional film 28a may be identical to or different from the materials of the lower electrode 12 and the upper electrode 16.

The piezoelectric layer 14 is made of, for example, monocrystalline lithium niobate, monocrystalline lithium tantalate, or monocrystalline quartz. The additional films 26a and 26b are metal films or insulating films having densities less than those of the upper electrode 16 and the lower electrode 12. For example, when the upper electrode 16 and the lower electrode 12 are formed of aluminum films (the density is 2700 kg/m$^3$), the additional films 26a and 26b are, for example, silicon oxide films (the density is 2200 kg/m$^3$). For example, when the upper electrode 16 and the lower electrode 12 are formed of ruthenium films (the density is 12370 kg/m$^3$), the additional films 26a and 26b are aluminum films (the density is 2700 kg/m$^3$).

Simulation 1

A simulation 1 is performed for the first embodiment and a first comparative example. In the first comparative example, neither the additional film 26a or 26b is provided. The simulation conditions are as follows.

Figure 2A:
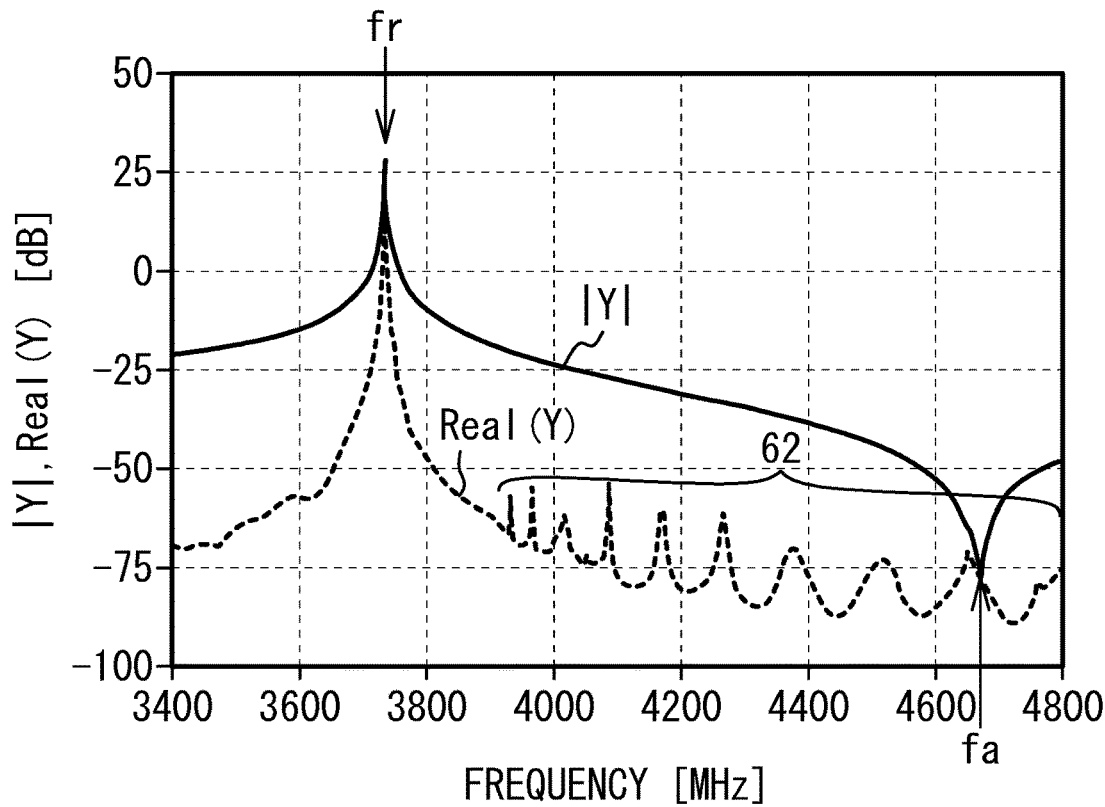
FIG. 2A is a graph of the real part Real(Y) and the absolute value |Y| of the admittance of a first comparative example versus frequency in a simulation 1.
Figure 2B:
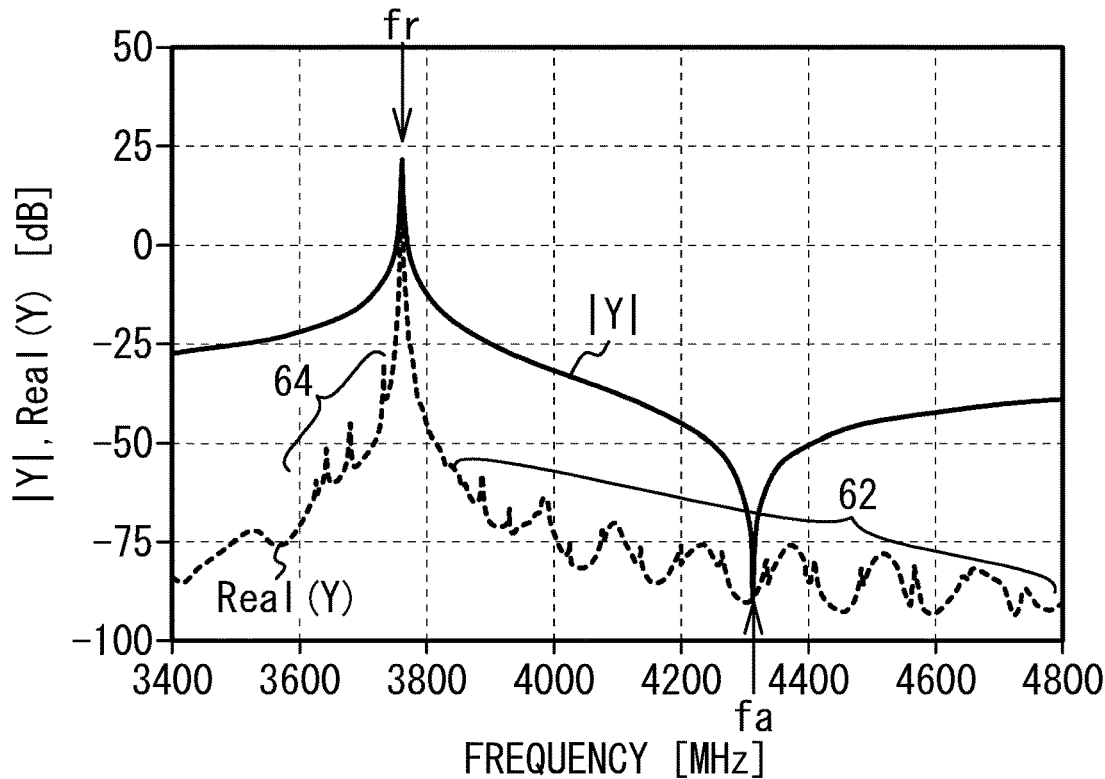
FIG. 2B is a graph of the real part Real(Y) and the absolute value |Y| of the admittance of the first embodiment versus frequency in the simulation 1.

The Conditions Common to the First Embodiment and the First Comparative Example:
  Wavelength λ of the acoustic wave: Thickness T14 of the piezoelectric layer 14×2
  Piezoelectric layer 14: Lithium niobate, the X direction is the X-axis orientation in the crystal orientation, and the Z direction is the direction rotated 105° from the Y-axis orientation to the X-axis orientation in the Y-axis-Z-axis plane.
  Condition in the X direction: It is assumed that the width of the resonance region 50 in the X direction is 30λ.
  Condition in the Y direction: It is assumed that the width in the Y direction is 0.5λ, and the boundary condition is infinitely continuous.
Conditions of the First Comparative Example:
  Additional film 28a: Aluminum film with a thickness T28a of 40 nm
  Upper electrode 16: Aluminum film with a thickness T16 of 52 nm
  Piezoelectric layer 14: Lithium niobate layer with a thickness T14 of 426 nm
  Lower electrode 12: Aluminum film with a thickness T12 of 55 nm
Conditions of the First Embodiment:
  Additional film 28a: Aluminum film with a thickness T28a of 42 nm
  Upper electrode 16: Aluminum film with a thickness T16 of 55 nm
  Additional film 26a: Silicon oxide (SiO$_2$) film with a thickness T26a of 10 nm (0.011λ)
  Piezoelectric layer 14: Lithium niobate layer with a thickness T14 of 451 nm
  Additional film 26b: Silicon oxide (SiO$_2$) film with a thickness T26b of 10 nm (0.011λ)
  Lower electrode 12: Aluminum film with a thickness T12 of 55 nm FIG. 2A is a graph of the real part Real(Y) and the absolute value |Y| of the admittance of the first comparative example versus frequency in the simulation 1, and FIG. 2B is a graph of the real part Real(Y) and the absolute value |Y| of the admittance of the first embodiment versus frequency in the simulation 1. In the absolute value |Y| of the admittance, peaks are observed at the resonant frequency and the antiresonant frequency. In the real part Real(Y) of the admittance, the spurious response is larger than that in the absolute value |Y|.

As presented in FIG. 2A, in |Y| of the first comparative example, the difference between the antiresonant frequency fa and the resonant frequency fr is large. In Real(Y), spurious emissions 62 are generated at frequencies higher than the resonant frequency fr. Spurious emissions are generated little at frequencies lower than the resonant frequency fr. The reason why spurious emissions are relatively small in the first comparative example is because provision of the additional film 28a makes the acoustic velocity in the edge region 52 less than the acoustic velocity in the center region 54, and the piston mode is thereby achieved. This reduces spurious emissions due to the standing wave of the acoustic wave in the lateral mode propagating mainly in the X direction.

As illustrated in FIG. 2B, in |Y| of the first embodiment, the difference between the antiresonant frequency fa and the resonant frequency fr is smaller than that of the first comparative example. The difference between the antiresonant frequency fa and the resonant frequency fr is proportional to the electromechanical coupling coefficient. Accordingly, the electromechanical coupling coefficient in the first embodiment is smaller than that in the first comparative example. In addition, the resonance characteristics deteriorate little compared with the first comparative example. As described above, it is possible to reduce the electromechanical coupling coefficient without deteriorating the resonance characteristics by providing the additional films 26a and 26b.

In Real(Y), in addition to the spurious emissions 62 at frequencies higher than the resonant frequency fr, spurious emissions 64 are generated at frequencies lower than the resonant frequency fr.

The displacement distribution in the Y direction at the resonant frequency in the center region 54 and the displacement distribution in the X direction in the edge region 52 were simulated for different total thicknesses T26a+T26b of the additional films 26a and 26b in the first embodiment. In the first embodiment, a sample A1 of which the total thickness T26a+T26b of the additional films 26a and 26b is 0.022λ and a sample A2 of which the total thickness T26a+T26b of the additional films 26a and 26b is 0.045λ were simulated. The film thicknesses of the films other than the additional films 26a and 26b in the first embodiment were adjusted so as to make the resonant frequency equal to that of the first comparative example.

Figure 3A:
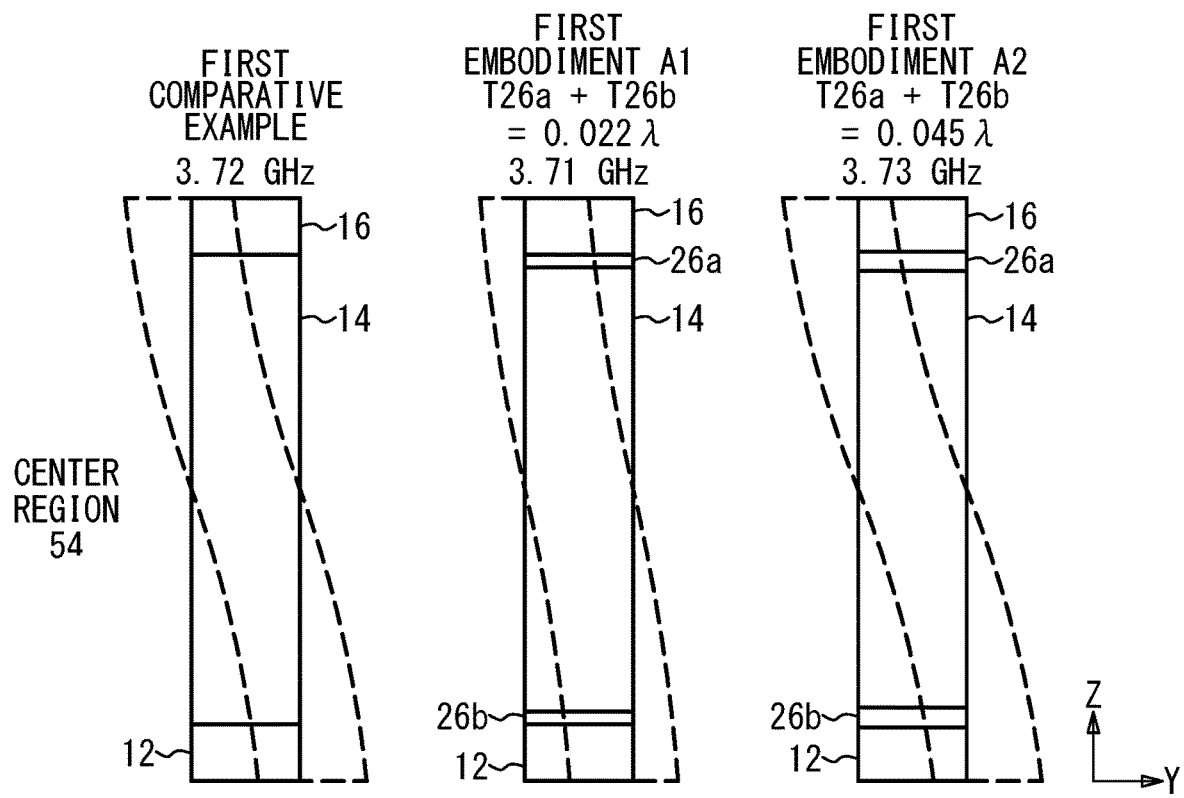
FIG. 3A illustrates displacement distributions in a Y direction in a center region 54 of the first comparative example and the first embodiment.
Figure 3B:
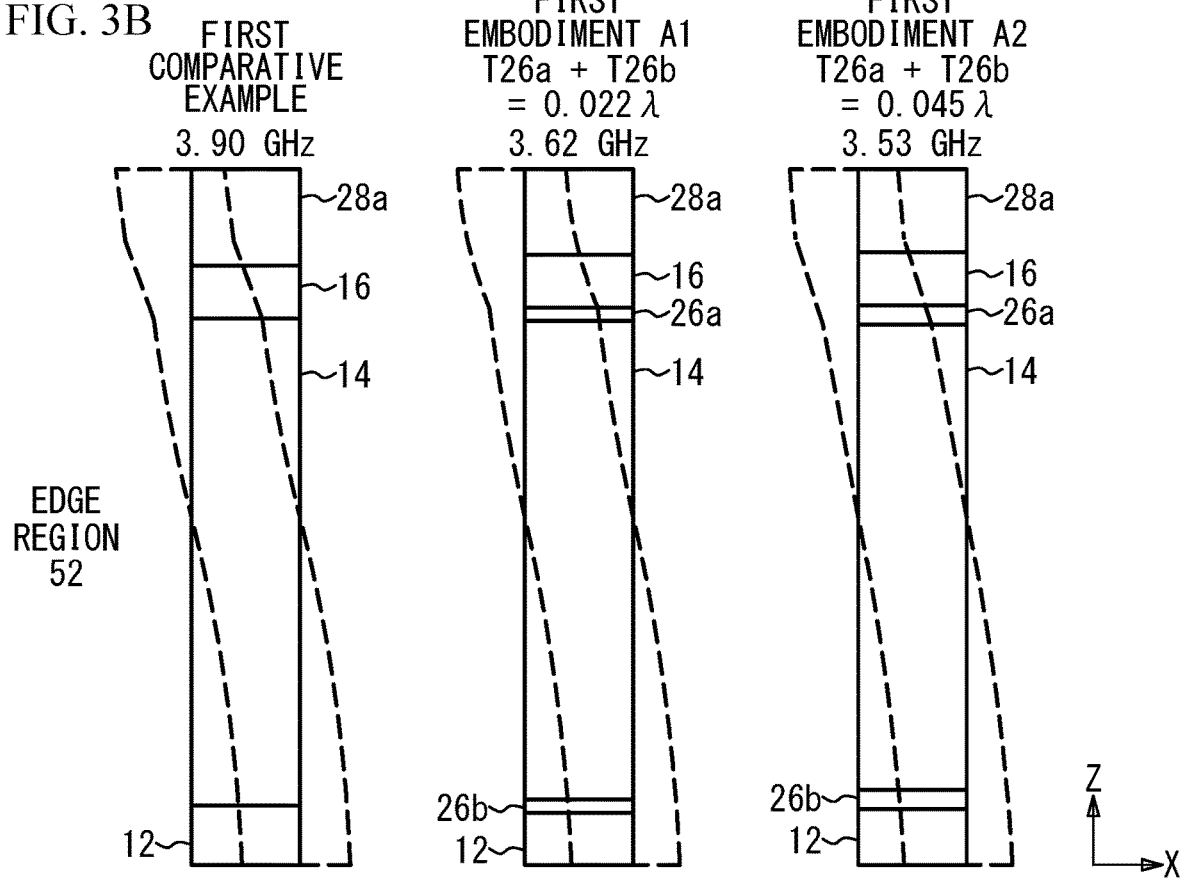
FIG. 3B illustrates displacement distributions in an X direction in an edge region 52 of the first comparative example and the first embodiment.

FIG. 3A illustrates the displacement distributions in the Y direction in the center region 54 of the first comparative example and the first embodiment, and FIG. 3B illustrates the displacement distributions in the X direction in the edge region 52 of the first comparative example and the first embodiment. The longitudinal direction is the Z direction, and the lateral direction is the Y direction. The solid lines indicate the lower electrode 12, the additional film 26b, the piezoelectric layer 14, the additional film 26a, the upper electrode 16, and the additional film 28a. The dashed line exaggeratingly illustrates the displacement of each layer due to the acoustic wave. The shift of the dashed line from the solid line corresponds to the magnitude of the displacement. The value of the frequency is the frequency at which the displacement is largest.

With reference to FIG. 3A, the displacement in the Y direction in the center region 54 corresponds to the displacement of the thickness-shear vibration that is the primary mode. The crystal orientation of the piezoelectric layer 14 was set so that the displacement in the X direction was generated little in the center region 54. In the center region 54, the frequency at which the displacement in the Y direction becomes largest is the resonant frequency. The resonant frequencies of the first comparative example, the sample A1 of the first embodiment, and the sample A2 of the first embodiment are 3.72 GHz, 3.71 GHz, and 3.73 GHz, respectively, and are approximately equal.

With reference to FIG. 3B, the displacement in the X direction is generated in the edge region 52. The displacement in the X direction becomes the spurious emission. In the first comparative example, the frequency at which the displacement in the X direction becomes largest is 3.90 GHz. This frequency is higher than 3.72 GHz that is the resonant frequency fr. As illustrated in FIG. 2A, at frequencies higher than the resonant frequency fr, other spurious emissions exist, and the influence of the spurious emission due to the displacement in the X direction is small.

In the first embodiment, the frequency at which the displacement in the X direction in the sample A1 is largest is 3.62 GHz, and the frequency at which the displacement in the X direction in the sample A2 is largest is 3.53 GHz. These frequencies are lower than 3.71 GHz and 3.73 GHz that are the resonant frequencies fr, respectively. Therefore, as illustrated in FIG. 2B, the spurious emissions 62 due to the displacement in the X direction are generated at frequencies lower than the resonant frequency fr.

Figure 4:
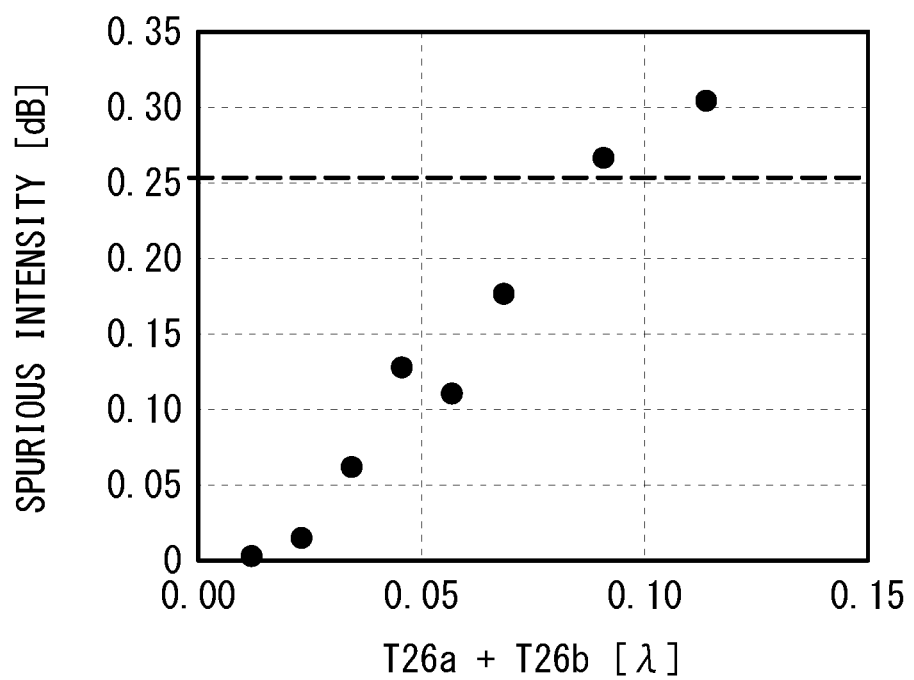
FIG. 4 is a graph of the intensity of a spurious emission versus the total thickness T26a+T26b of additional films 26a and 26b in the first embodiment.

The magnitude of the spurious emission 62 that is displaced in the X direction was simulated for different total thicknesses T26a+T26b of the additional films 26a and 26b. FIG. 4 is a graph of the magnitude of the spurious emission versus the total thickness T26a+T26b of the additional films 26a and 26b in the first embodiment. As illustrated in FIG. 4, as the total thickness T26a+T26b of the additional films increases, the spurious intensity increases. As indicated by the dashed line, the spurious intensity is desired to be 0.25 dB or less, and it is possible to make the spurious intensity 0.25 dB or less by adjusting the total thickness T26a+T26b to be 0.09λ or less.

The temperature coefficient of the elastic modulus of the silicon oxide is opposite in sign to the temperature coefficient of the elastic modulus of the piezoelectric layer 14. Thus, the temperature coefficient of frequency (TCF) with respect to the total thicknesses T26a+T26b of the additional films 26a and 26b was simulated for the resonant frequency fr and the antiresonant frequency fa.

Figure 5:
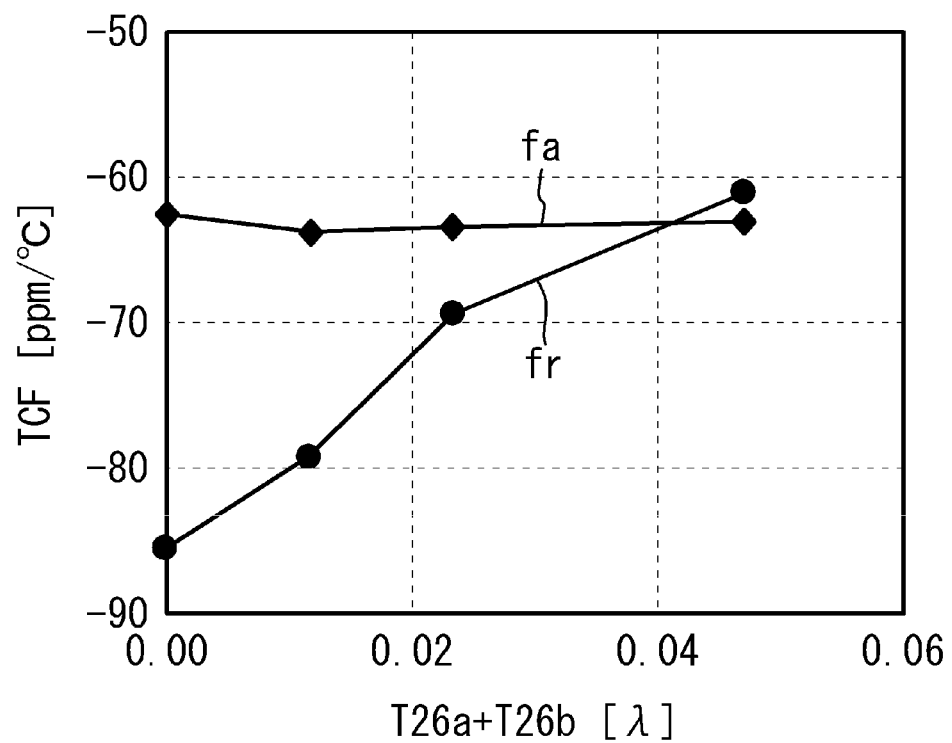
FIG. 5 is a graph of a TCF versus the total thickness T26a+T26b of the additional films 26a and 26b in the first embodiment.

FIG. 5 is a graph of the TCF versus the total thickness T26a+T26b of the additional films 26a and 26b in the first embodiment. As illustrated in FIG. 5, as the total thickness T26a+T26b of the additional film increases, the absolute value of the temperature coefficient of the resonant frequency fr decreases. The absolute value of the temperature coefficient of the antiresonant frequency fa depends little on the total thickness T26a+T26b.

Simulation 2

A simulation 2 was conducted for the first embodiment and the first comparative example. The common conditions are the same as those of the simulation 1.

Conditions of the First Comparative Example:
  Additional film 28a: Ruthenium film with a thickness T28a of 28 nm
  Upper electrode 16: Ruthenium film with a thickness T16 of 41 nm
  Piezoelectric layer 14: Lithium niobate layer with a thickness T14 of 282 nm
  Lower electrode 12: Ruthenium film with a thickness T12 of 41 nm
Conditions of the First Embodiment:
  Additional film 28a: Ruthenium film with a thickness T28a of 20 nm
  Upper electrode 16: Ruthenium film with a thickness T16 of 31 nm
  Additional film 26a: Aluminum film with a thickness T26a of 31 nm (0.06λ)
  Piezoelectric layer 14: Lithium niobate layer with a thickness T14 of 251 nm
  Additional film 26b: Aluminum film with a thickness T26b of 31 nm (0.06λ)
  Lower electrode 12: Ruthenium film with a thickness T12 of 31 nm FIG. 6A is a graph of the real part Real(Y) and the absolute value |Y| of the admittance of the first comparative example versus frequency in the simulation 2, and FIG. 6B is a graph of the real part Real(Y) and the absolute value |Y| of the admittance of the first embodiment in the simulation 2.

Figure 6A:
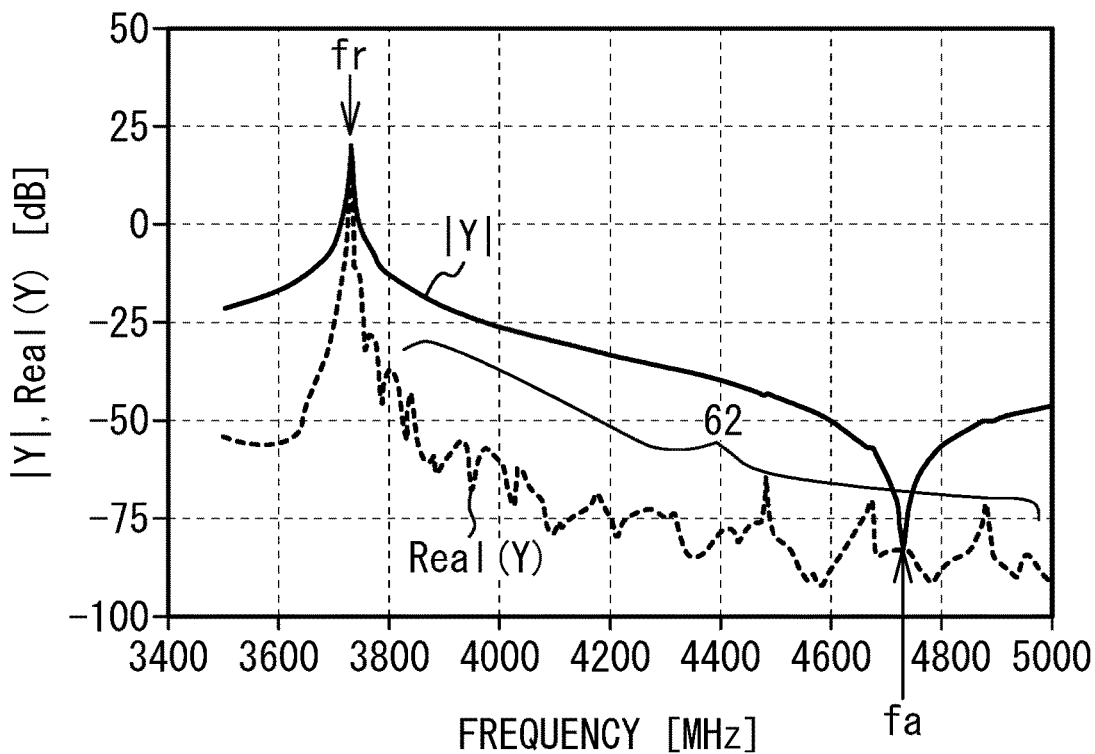
FIG. 6A is a graph of the real part Real(Y) and the absolute value |Y| of the admittance of the first comparative example versus frequency in a simulation 2.

As illustrated in FIG. 6A, in |Y| of the first comparative example, the difference between the antiresonant frequency fa and the resonant frequency fr is large. In Real(Y), the spurious emissions 62 are generated at frequencies higher than the resonant frequency fr. Spurious emissions are generated little at frequencies lower than the resonant frequency fr.

Figure 6B:
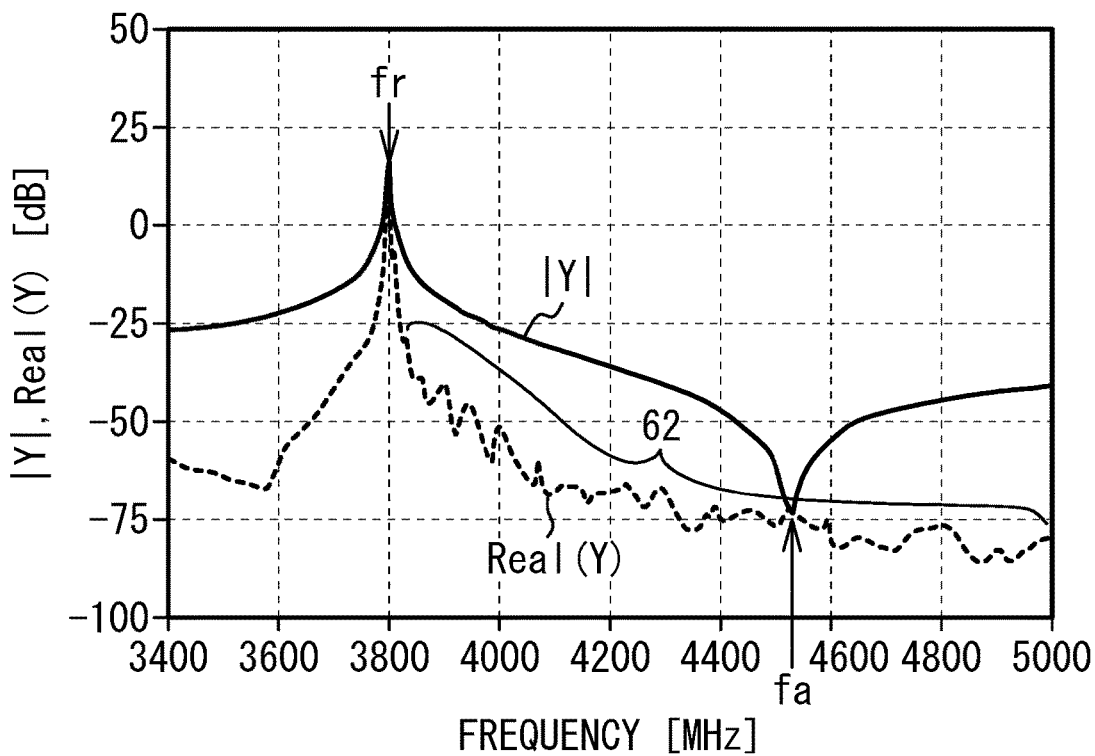
FIG. 6B is a graph of the real part Real(Y) and the absolute value |Y| of the admittance of the first embodiment versus frequency in the simulation 2.

As illustrated in FIG. 6B, in |Y| of the first embodiment, the difference between the antiresonant frequency fa and the resonant frequency fr is smaller than that in the first comparative example, and the electromechanical coupling coefficient of the first embodiment is smaller than that of the first comparative example. In addition, the resonance characteristics deteriorate little, compared with that of the first comparative example. As seen above, even when the additional films 26a and 26b are metal films, it is possible to reduce the electromechanical coupling coefficient with little deterioration in the resonance characteristic. Unlike the simulation 1, the spurious emissions 64 observed in FIG. 2B are not observed. This is considered because the thickness T26a of the additional film 26a and the thickness T28a of the additional film 28a are thin.

In the first embodiment, the additional film 26a (a first additional film) is interposed between the upper electrode 16 (one of a pair of the electrodes) and the piezoelectric layer 14, and the additional film 26b (another first additional film) is interposed between the lower electrode 12 (another of the pair of electrodes) and the piezoelectric layer 14. The densities of the additional films 26a and 26b are less than the densities of the upper electrode 16 and the lower electrode 12. This configuration reduces the electromechanical coupling coefficient without largely deteriorating the resonance characteristics. As described above, it is possible to adjust the electromechanical coupling coefficient without largely deteriorating the resonance characteristics by providing the additional films 26a and 26b.

Table 1 lists the densities of typical metals.

TABLE 1

| | Material | | | | | |
|---|---|---|---|---|---|---|
| | Al | Ti | Cu | Cr | Mo | Ru |
| Density [kg/m$^3$] | 2700 | 4500 | 8900 | 7100 | 10200 | 12370 |

Table 2 lists the densities and the relative permittivities of typical dielectric substances.

TABLE 2

| | Material | | | |
|---|---|---|---|---|
| | LN | LT | SiO$_2$ | Ta$_2$O$_5$ |
| Density [kg/m$^3$] | 4640 | 7450 | 2200 | 8200 |
| Relative permittivity | 44.3 | 51.7 | 4.07 | 27.9 |

As presented in Table 1 and Table 2, when the upper electrode 16 and the lower electrode 12 are made of ruthenium, the additional films 26a and 26b can be made of aluminum, titanium, copper, chrome, molybdenum, silicon oxide (SiO$_2$), or tantalum oxide (Ta$_2$O$_5$) having a smaller density than ruthenium. When the upper electrode 16 and the lower electrode 12 are made of aluminum, the additional films 26a and 26b can be made of silicon oxide (SiO$_2$) having a smaller density than aluminum. The upper electrode 16 or the lower electrode 12, or both the upper electrode 16 and the lower electrode 12 are mainly made of aluminum, and the additional films 26a and 26b are mainly made of silicon oxide.

The lower electrode 12 or the upper electrode 16, or both the upper electrode 16 and the lower electrode 12 include a single metal film or a plurality of metal films that are stacked. The single film or each of the plurality of films is mainly made of a metal, such as ruthenium, chrome, copper, molybdenum, tungsten, tantalum, platinum, rhodium, or iridium. Chrome has the smallest density among these materials. Thus, the additional films 26a and 26b are made to be films (e.g., metal films) made of a material having a smaller density than aluminum. This configuration allows to adjust the electromechanical coupling coefficient without largely deteriorating the resonance characteristics. To achieve such additional films 26a and 26b, the additional films 26a and 26b, are mainly made of aluminum. The term "mainly made of a certain metal" means that impurities may be intentionally or unintentionally contained, and for example, 50 atomic % or greater of the certain metal, or 80 atomic % or greater of the certain metal is contained. The term "the additional films 26a and 26b are mainly made of silicon oxide" means that the additional films 26a and 26b may contain impurities intentionally or unintentionally. For example, the sum of the O concentration and the Si concentration is 50 atomic % or greater, or 80% atomic % or greater, and each of the O concentration and the Si concentration is 10 atomic % or greater, or 20 atomic % or greater. Each of one or more metal films of each of the upper electrode 16 and the lower electrode 12 preferably has a substantially consistent density. Each of the additional films 26a and 26b preferably has a substantially consistent density.

When the additional films 26a and 26b are insulating films, the additional films 26a and 26b preferably have relative permittivities lower than the relative permittivity of the piezoelectric layer 14. This configuration makes the electrostatic capacitance between the upper electrode 16 and the lower electrode 12 smaller than that in the case where neither the additional film 26a or 26b is provided. Thus, the electromechanical coupling coefficient becomes further smaller. As presented in Table 2, when the piezoelectric layer 14 is made of lithium niobate (LN) or lithium tantalate (LT), silicon oxide (SiO$_2$) or tantalum oxide (Ta$_2$O$_5$) having a smaller relative permittivity than LN and LT is preferably used as the additional films 26a and 26b. The materials of the additional films 26a and 26b may be materials other than the materials described above.

To efficiently adjust the electromechanical coupling coefficient, the densities of the additional films 26a and 26b are preferably equal to or less than 90% of the densities of the upper electrode 16 and the lower electrode 12, more preferably equal to or less than 80% of the densities of the upper electrode 16 and the lower electrode 12, further preferably equal to or less than 50% of the densities of the upper electrode 16 and the lower electrode 12. The relative permittivities of the additional films 26a and 26b are preferably equal to or less than 90% of the relative permittivity of the piezoelectric layer 14, more preferably equal to or less than 80% of the relative permittivity of the piezoelectric layer 14, further preferably equal to or less than 50% of the relative permittivity of the piezoelectric layer 14. Not to deteriorate the resonance characteristics, the densities of the additional films 26a and 26b are preferably equal to or greater than 5% of the densities of the upper electrode 16 and the lower electrode 12. The relative permittivities of the additional films 26a and 26b are preferably equal to or greater than 5% of the relative permittivity of the piezoelectric layer 14.

The densities of the lower electrode 12, the upper electrode 16, and the additional films 26a and 26b are the densities calculated from the physical properties of the materials constituting the lower electrode 12, the upper electrode 16, and the additional films 26a and 26b. Thus, when the materials constituting the lower electrode 12, the upper electrode 16, and the additional films 26a and 26b are determined, the densities of the lower electrode 12, the upper electrode 16, and the additional films 26a and 26b can be determined using the densities, which are the physical property, of the materials. When at least one of the lower electrode 12, the upper electrode 16, and the additional films 26a and 26b is formed of two or more films, the density of the at least one of the lower electrode 12, the upper electrode 16, and the additional films 26a and 26b is calculated from the density determined from the densities of the materials constituting the two or more films and the total thickness of the two or more films.

When one of the lower electrode 12 and the upper electrode 16 is viewed in a plan view, no additional film 28a (a second additional film) is provided in the center region 54, which is the region including the center of gravity of the resonance region 50, and the additional film 28a is provided in at least a part of each of the edge regions 52, which sandwich the center region 54 therebetween and are other than the center region 54 of the resonance region 50. This structure achieves the piston mode, and therefore, the spurious emissions due to the standing wave of the acoustic wave in the lateral mode propagating mainly in the X direction are reduced.

When the additional films 26a and 26b are provided, the frequency at which the spurious emission in the X direction is generated becomes lower than the resonant frequency fr. One additional film 26a, one additional film 26b, or the additional films 26a and 26b located away from each other are provided as the additional film. When one additional film 26a or one additional film 26b is provided as the additional film, the thickness T26a of the one additional film 26a and the thickness T26b of the one additional film 26b are adjusted to be greater than 0 and equal to or less than 0.18 times the thickness T14 of the piezoelectric layer 14 (0.09 times of λ). When the additional films 26a and 26b are provided as the additional film, the total thickness T26a+T26b of one or more additional films 26a and 26b is adjusted to be greater than 0 and equal to or less than 0.18 times the thickness T14 of the piezoelectric layer 14 (0.09 times of λ). This configuration makes the spurious emissions generated at frequencies lower than the resonant frequency fr small as illustrated in FIG. 4. To reduce spurious emissions, the total thickness T26a+T26b of the additional films 26a and 26b is preferably equal to or less than 0.15 times the thickness T14 of the piezoelectric layer 14, more preferably equal to or less than 0.10 times the thickness T14 of the piezoelectric layer 14. To reduce the electromechanical coupling coefficient, the total thickness T26a+T26b of the additional films 26a and 26b is preferably equal to or greater than 0.01 times the thickness T14 of the piezoelectric layer 14, more preferably equal to or greater than 0.02 times the thickness T14 of the piezoelectric layer 14.

Figure 7A:
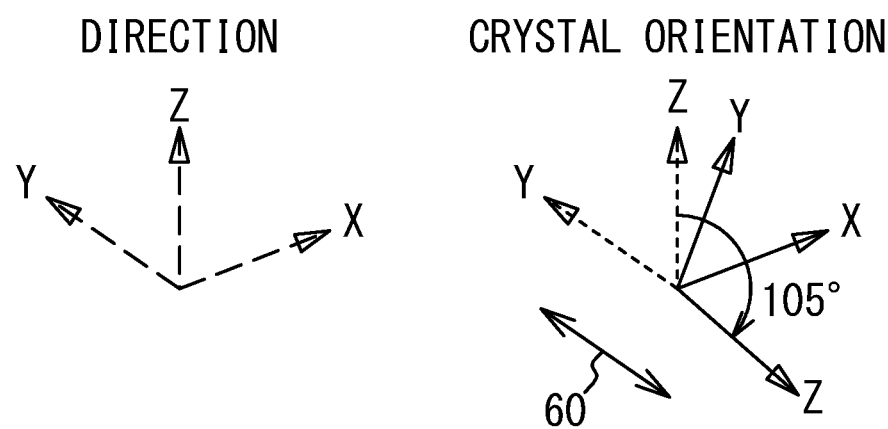
FIG. 7A and FIG. 7B are perspective views illustrating the crystal orientations of a piezoelectric layer in the first embodiment.
Figure 7B:
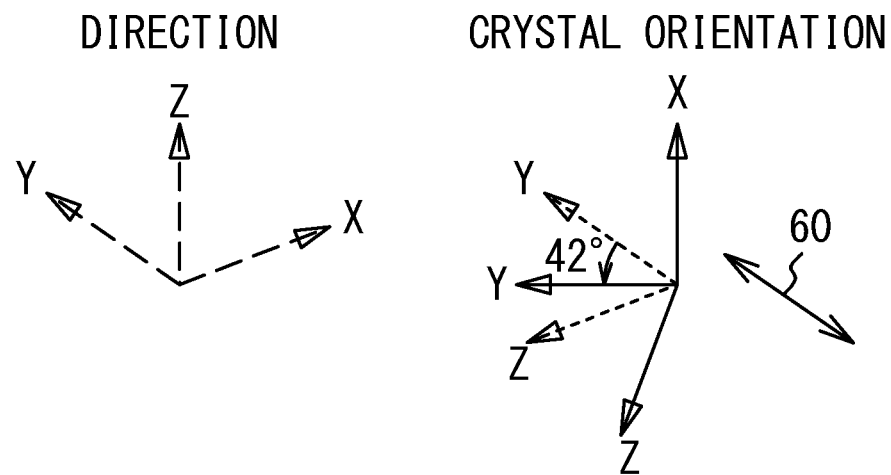

FIG. 7A and FIG. 7B are perspective views illustrating the crystal orientations of the piezoelectric layer in the first embodiment. FIG. 7A illustrates a case where the piezoelectric layer 14 is made of lithium niobate, and FIG. 7B illustrates a case where the piezoelectric layer 14 is made of lithium tantalate. The dashed line arrows at the left side in FIG. 7A and FIG. 7B correspond to the X direction, the Y direction, and the Z direction in FIG. 1A and FIG. 1B. The solid lines at the right side indicate the orientations of the crystal axes of the piezoelectric layer 14.

As illustrated in FIG. 7A, when the piezoelectric layer 14 is made of lithium niobate, as indicated by the dotted line arrows indicating the crystal orientations, the X direction, the Y direction, and the Z direction (the dashed line arrows) are adjusted to be the +X-axis orientation, the +Y-axis orientation, and the +Z-axis orientation of the crystal orientations, respectively, and the +Y-axis orientation and the +Z-axis orientation are rotated 1050 around the X-axis orientation from the +Y-axis orientation toward the +Z-axis orientation on the Y-axis-Z-axis plane. The Y-axis orientation after rotation and the Z-axis orientation after rotation are indicated by the solid line arrows. When rotated as described above, the Z direction becomes the direction rotated 105° from the +Z-axis orientation to the +Y-axis orientation. In this case, the Y direction is the thickness-shear vibration direction 60. The Euler angles of the piezoelectric layer 14 become (0°, 105°, 0°).

When the piezoelectric layer 14 is a monocrystalline lithium niobate substrate, a rotated Y-cut lithium niobate substrate is used as the piezoelectric layer 14. In this case, the normal direction (the Z direction) of the upper surface of the piezoelectric layer 14 is the direction in the Y-axis-Z-axis plane. Thus, the thickness-shear vibration is generated in the plane direction of the piezoelectric layer 14. The X-axis orientation preferably exists within a range of ±5° from the plane direction of the piezoelectric layer 14, more preferably within a range of ±1° from the plane direction of the piezoelectric layer 14.

The normal direction (the Z direction) of the upper surface of the piezoelectric layer 14 is adjusted to be the direction rotated 105° from the +Z-axis orientation to the +Y-axis orientation of the crystal orientation. In this case, the thickness-shear vibration direction 60 and the direction perpendicular to the thickness-shear vibration direction 60 are the plane directions of the piezoelectric layer 14. The Z direction is preferably adjusted to exist within a range of ±5° from the direction rotated 105° from the +Z-axis orientation to the +Y-axis orientation, more preferably within a range of ±1° from the direction rotated 105° from the +Z-axis orientation to the +Y-axis orientation.

As illustrated in FIG. 7B, when the piezoelectric layer 14 is made of lithium tantalate, as indicated by the dotted line arrows indicating the crystal orientations, the X direction, the Y direction, and the Z direction (the dashed line arrows) are adjusted to be the −Z-axis orientation, the +Y-axis orientation, and the +X-axis orientation of the crystal orientations, respectively, and the +Y-axis orientation and the +Z-axis orientation are rotated 42° around the X-axis orientation from the +Y-axis orientation to the +Z-axis orientation on the Y-axis-Z-axis plane. The Y-axis orientation after rotation and the Z-axis orientation after rotation are indicated by the solid line arrows. When rotated as described above, the Y direction becomes the direction rotated 42° from the +Y-axis orientation to the −Z-axis orientation. In this case, the Y direction is the thickness-shear vibration direction 60. The Euler angles of the piezoelectric layer 14 are (138°, 90°, 90°).

When the piezoelectric layer 14 is a monocrystalline lithium tantalate substrate, an X-cut lithium tantalate substrate is used as the piezoelectric layer 14. In this case, the normal direction (the Z direction) of the upper surface of the piezoelectric layer 14 is the X-axis orientation. Thus, the thickness-shear vibration is generated in the plane direction of the piezoelectric layer 14. The X-axis orientation is preferably adjusted to exist within a range of ±5° from the normal direction of the piezoelectric layer 14, more preferably within a range of ±1° from the normal direction of the piezoelectric layer 14.

The Y direction of the piezoelectric layer 14 is adjusted to be the direction rotated 42° from the +Y-axis orientation to the −Z-axis orientation of the crystal orientation. Therefore, among the plane directions of the piezoelectric layer 14, the direction rotated 42° from the +Y-axis orientation to the −Z-axis orientation is the thickness-shear vibration direction 60.

First Variation of the First Embodiment

Figure 8A:
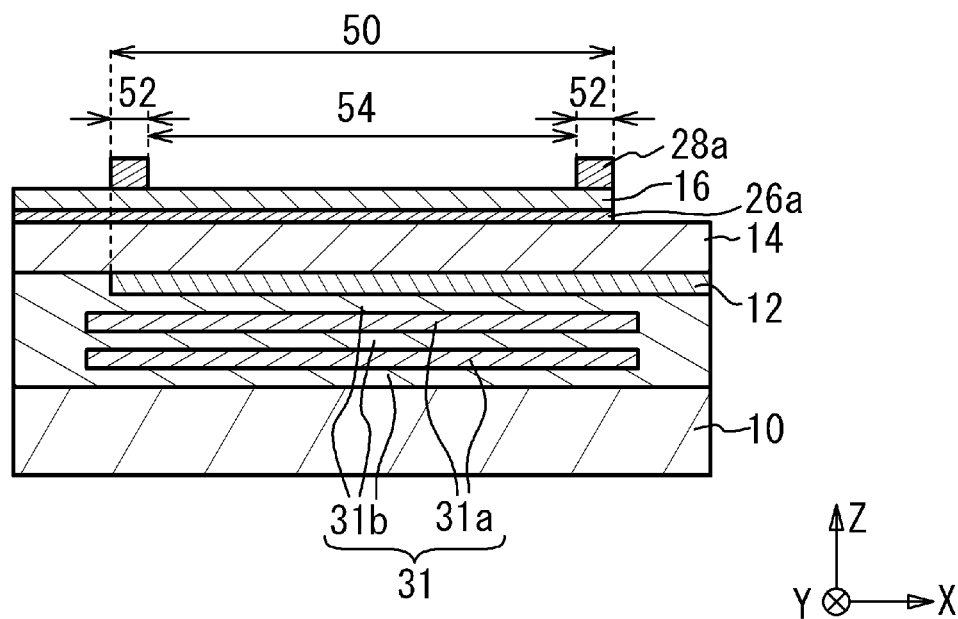
FIG. 8A and FIG. 8B are cross-sectional views of piezoelectric thin film resonators in accordance with first and second variations of the first embodiment, respectively.

FIG. 8A is a cross-sectional view of a piezoelectric thin film resonator in accordance with a first variation of the first embodiment. As illustrated in FIG. 8A, in the first variation of the first embodiment, the additional film 26a is interposed between the piezoelectric layer 14 and the upper electrode 16. No additional film 26b is interposed between the piezoelectric layer 14 and the lower electrode 12. Other structures are the same as those of the first embodiment, and the description thereof is thus omitted.

Second Variation of the First Embodiment

Figure 8B:
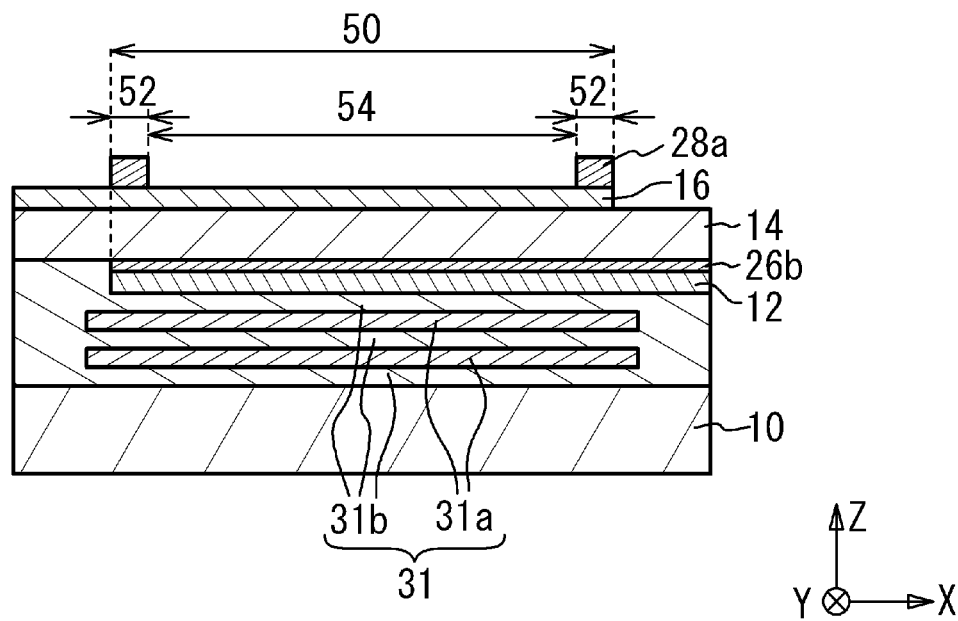

FIG. 8B is a cross-sectional view of a piezoelectric thin film resonator in accordance with a second variation of the first embodiment. As illustrated in FIG. 8B, in the second variation of the first embodiment, the additional film 26b is interposed between the piezoelectric layer 14 and the lower electrode 12. No additional film 26a is interposed between the piezoelectric layer 14 and the upper electrode 16. Other structures are the same as those of the first embodiment, and the description thereof is thus omitted. As in the first and second variations of the first embodiment, it is sufficient if at least one of the additional films 26a and 26b is provided.

Third Variation of the First Embodiment

Figure 9A:
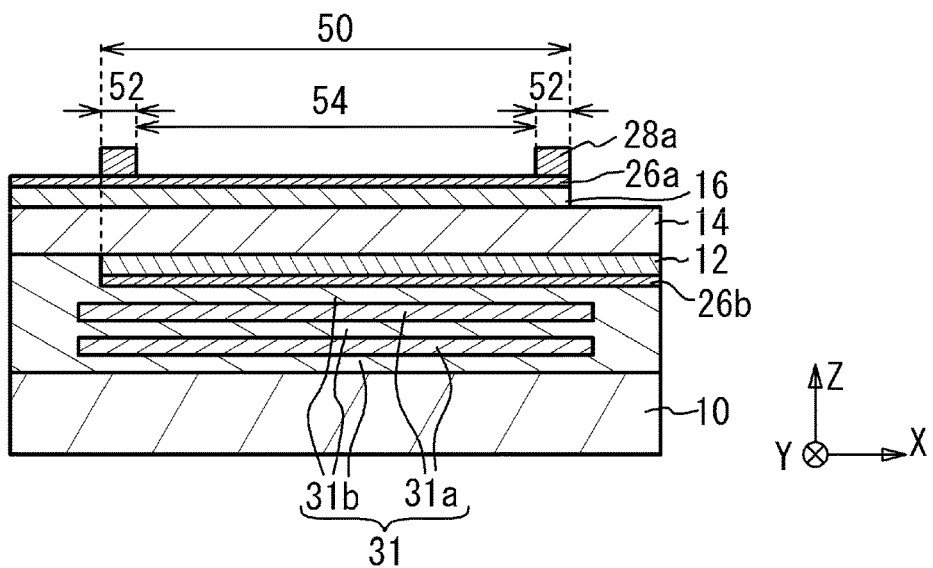
FIG. 9A to FIG. 9C are cross-sectional views of piezoelectric thin film resonators in accordance with third to fifth variations of the first embodiment, respectively.

FIG. 9A is a cross-sectional view of a piezoelectric thin film resonator in accordance with a third variation of the first embodiment. As illustrated in FIG. 9A, in the third variation of the first embodiment, the additional film 26a is disposed on the upper surface of the upper electrode 16. The additional film 26b is disposed on the lower surface of the lower electrode 12. Other structures are the same as those of the first embodiment, and the description thereof is thus omitted. As in the third variation of the first embodiment, the additional film 26a may be disposed on the upper surface of the upper electrode 16, and the additional film 26b may be disposed on the lower surface of the lower electrode 12.

Fourth Variation of the First Embodiment

Figure 9B:
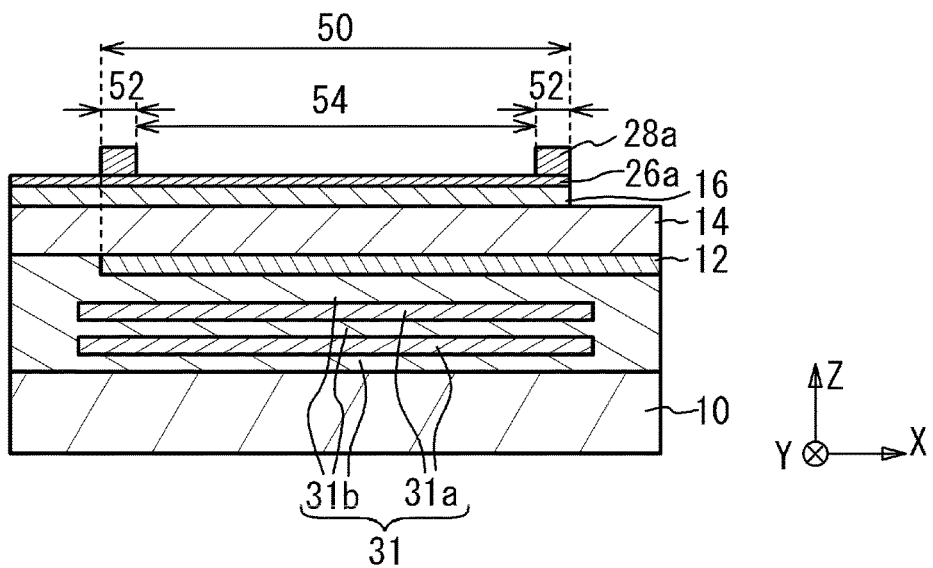

FIG. 9B is a cross-sectional view of a piezoelectric thin film resonator in accordance with a fourth variation of the first embodiment. As illustrated in FIG. 9B, in the fifth variation of the first embodiment, the additional film 26a is disposed on the upper surface of the upper electrode 16. No additional film 26b is disposed on the lower surface of the lower electrode 12. Other structures are the same as those of the third variation of the first embodiment, and the description thereof is thus omitted.

Fifth Variation of the First Embodiment

Figure 9C:
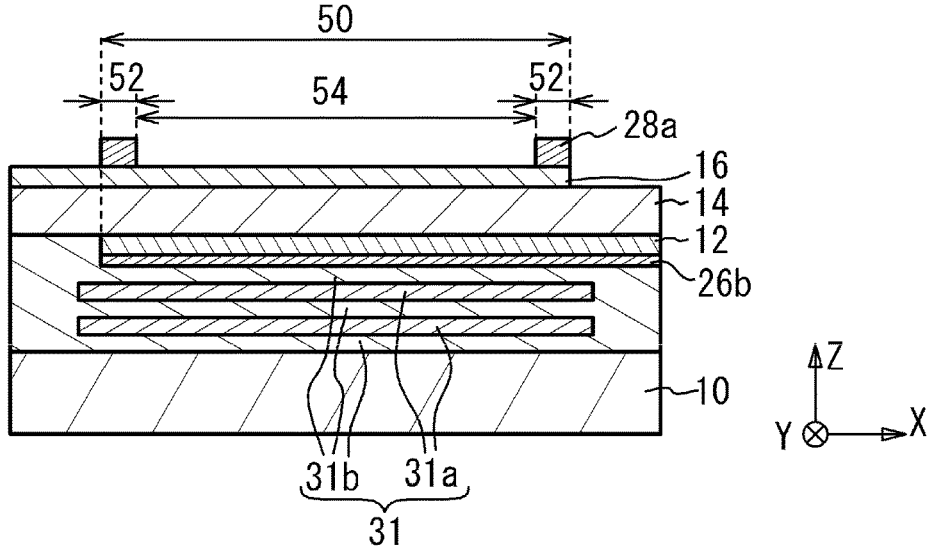

FIG. 9C is a cross-sectional view of a piezoelectric thin film resonator in accordance with a fifth variation of the first embodiment. As illustrated in FIG. 9C, in the fifth variation of the first embodiment, the additional film 26b is disposed on the lower surface of the lower electrode 12. No additional film 26a is provided on the upper surface of the upper electrode 16. Other structures are the same as those of the third variation of the first embodiment, and the description thereof is thus omitted. As in the third to fifth variations of the first embodiment, it is sufficient if at least one of the additional films 26a and 26b is provided.

Sixth Variation of the First Embodiment

Figure 10A:
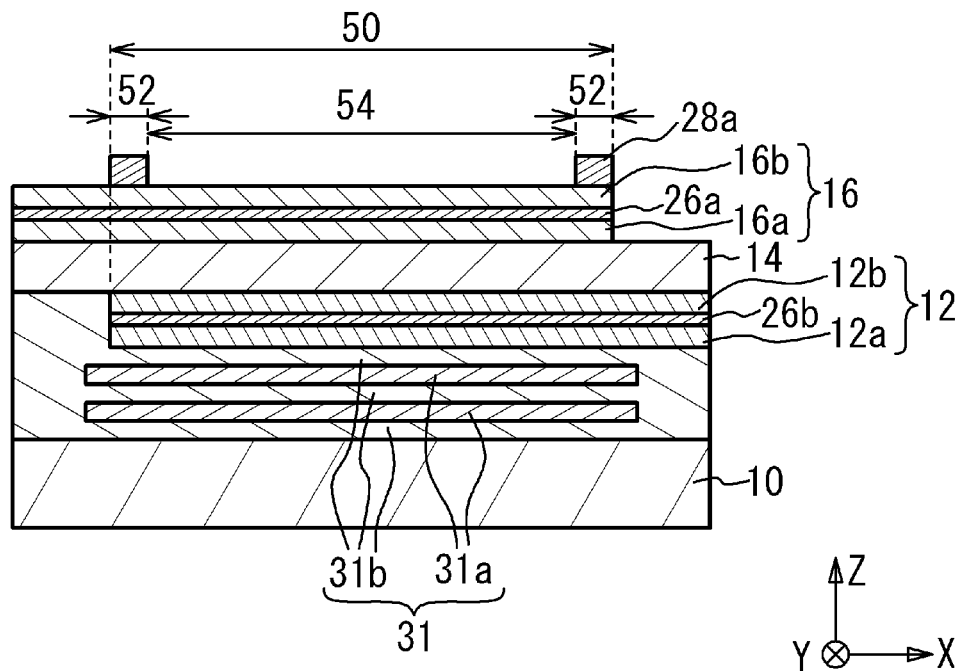
FIG. 10A and FIG. 10B are cross-sectional views of piezoelectric thin film resonators in accordance with sixth and seventh variations of the first embodiment, respectively.

FIG. 10A is a cross-sectional view of a piezoelectric thin film resonator in accordance with a sixth variation of the first embodiment. As illustrated in FIG. 10A, in the sixth variation of the first embodiment, the upper electrode 16 includes a plurality of metal layers 16a and 16b, and the additional film 26a is interposed between the metal layers 16a and 16b. The lower electrode 12 includes a plurality of metal layers 12a and 12b, and the additional film 26b is interposed between the metal layers 12a and 12b. Other structures are the same as those of the first embodiment, and the description thereof is thus omitted. As in the sixth variation of the first embodiment, the additional films 26a and 26b may be provided in the upper electrode 16 and the lower electrode 12, respectively. It is sufficient if at least one of the additional films 26a and 26b is provided.

Seventh Variation of the First Embodiment

Figure 10B:
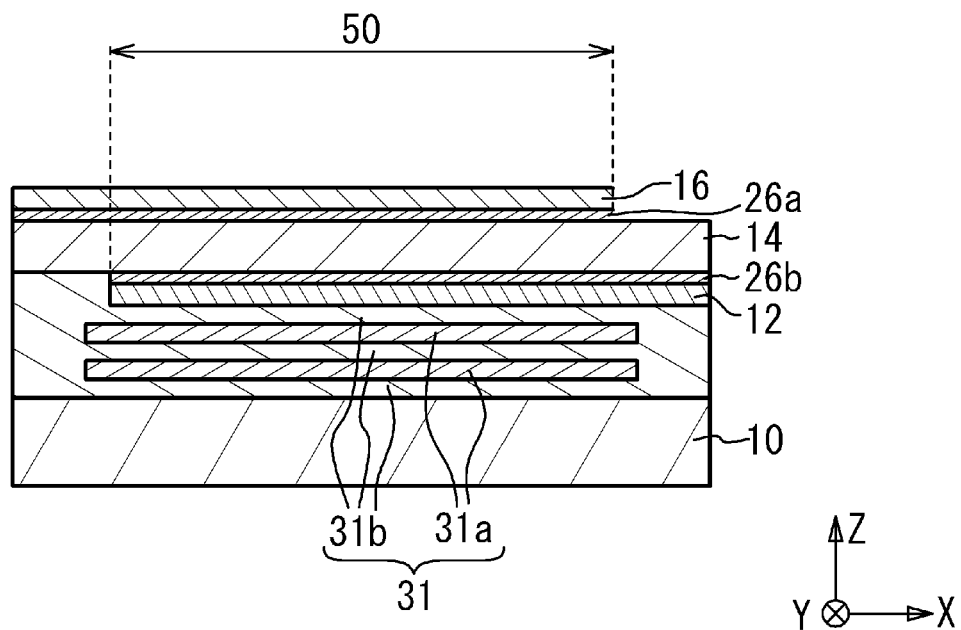

FIG. 10B is a cross-sectional view of a piezoelectric thin film resonator in accordance with a seventh variation of the first embodiment. As illustrated in FIG. 10B, in the seventh variation of the first embodiment, no additional film 28a is provided. Other structures are the same as those of the first embodiment, and the description thereof is thus omitted. As in the seventh variation of the first embodiment, even when no additional film 28a is provided, the electromechanical coupling coefficient can be adjusted by providing the additional films 26a and 26b.

As described in the first embodiment and the first to seventh variations thereof, one or more additional films 26a and 26b may be provided between the upper electrode 16 and the piezoelectric layer 14, between the lower electrode 12 and the piezoelectric layer 14, on the upper electrode 16, inside (inserted in) the upper electrode 16, under the lower electrode 12, inside (inserted in) the lower electrode 12, or at any of combinations of these places, for example, as long as the provision provides the above-described electromechanical coupling coefficient adjusting effects. It is sufficient if the density of the additional film 26a is smaller than the density of the upper electrode 16 and the density of the additional film 26b is smaller than the density of the lower electrode 12. The additional films 26a and 26b are preferably provided across the entire of the resonance region 50, but it is sufficient if the additional films 26a and 26b are provided in at least a part of the resonance region 50. To reduce the electromechanical coupling coefficient, the area of each of the regions where the additional films 26a and 26b are provided is preferably equal to or greater than 50% of the area of the resonance region 50, more preferably equal to or greater than 80% of the area of the resonance region 50.

Eighth Variation of the First Embodiment

Figure 11:
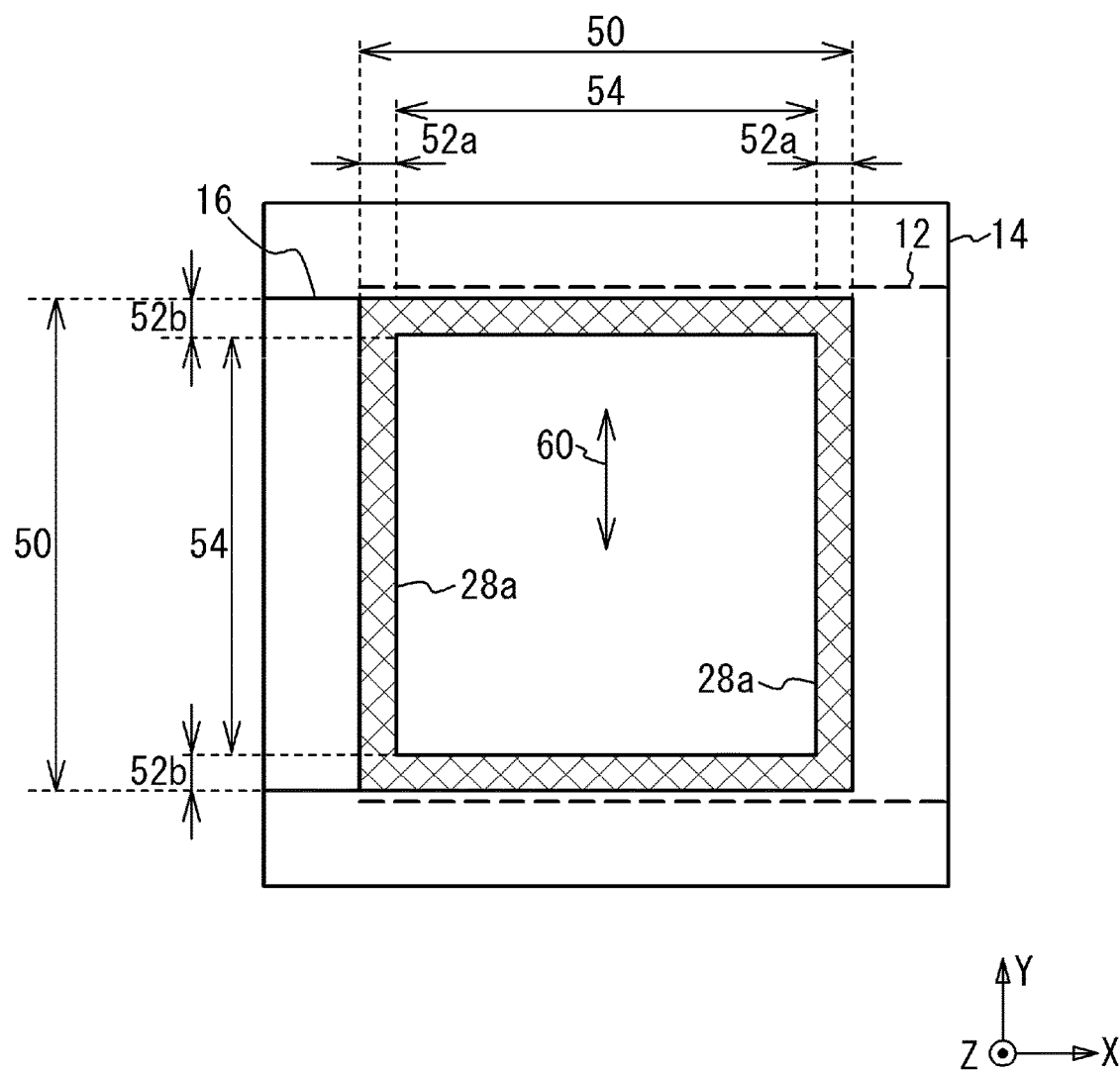
FIG. 11 is a plan view of a piezoelectric thin film resonator in accordance with an eighth variation of the first embodiment.

FIG. 11 is a plan view of a piezoelectric thin film resonator in accordance with an eighth variation of the first embodiment. As illustrated in FIG. 11, in the eighth variation of the first embodiment, the additional film 28a is disposed in each of edge regions 52a located in both sides of the resonance region 50 in the X direction. Furthermore, the additional film 28a is disposed in each of edge regions 52b located in both sides of the resonance region 50 in the Y direction. Thus, the additional film 28a is provided in the edge regions 52a and 52b surrounding the center region 54. The width of the additional film 28a in the X direction may be approximately equal to or different from the width of the additional film 28a in Y direction. Other structures are the same as those of the first embodiment, and the description thereof is thus omitted. In the eighth variation of the first embodiment, the lateral-mode spurious emissions due to the acoustic wave propagating in the X direction and the Y direction are reduced.

Ninth Variation of the First Embodiment

Figure 12:
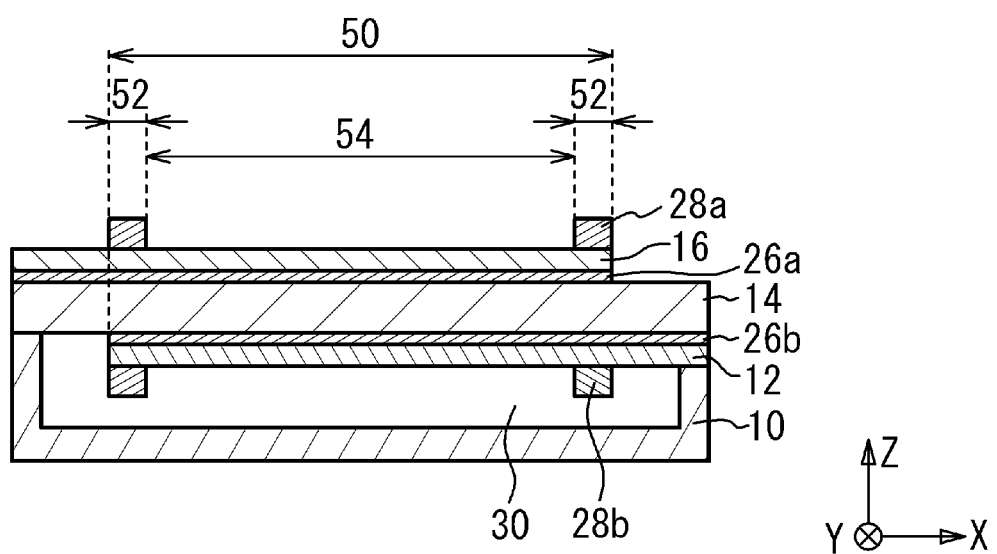
FIG. 12 is a cross-sectional view of a piezoelectric thin film resonator in accordance with a ninth variation of the first embodiment.

FIG. 12 is a cross-sectional view of a piezoelectric thin film resonator in accordance with a ninth variation of the first embodiment. As illustrated in FIG. 12, in the ninth variation of the first embodiment, an air gap 30 is provided instead of the acoustic mirror 31. The additional film 28a is disposed on the upper surface of the upper electrode 16 in each of the edge regions 52, and an additional film 28b is disposed on the lower surface of the lower electrode 12 in each of the edge regions 52. The width of the additional film 28a may be approximately equal to or different from the width of the additional film 28b. The thickness of the additional film 28a may be approximately equal to or different from the thickness of the additional film 28b. The main component of the additional film 28a may be identical to or different from the main component of the additional film 28b. Other structures are the same as those of the first embodiment and the first variation of the first embodiment, and the description thereof is thus omitted.

As in the ninth variation of the first embodiment, the additional film 28a and the additional film 28b may be provided. That is, the additional films 28a and 28b may be provided on the upper electrode 16 as well as on the lower electrode 12, as shown in FIG. 12. Other than the configuration illustrated in FIG. 12, the additional films 28a and 28b may be provided between the upper electrode 16 and the piezoelectric layer 14 in the edge regions 52, between the lower electrode 12 and the piezoelectric layer 14 in the edge regions 52, inside (inserted in) the upper electrode 16 in the edge regions 52, inside (inserted in) the lower electrode 12 in the edge regions 52, on the upper electrode 16 in the edge regions 52, under the lower electrode 12 in the edge regions 52, or at any of combinations of these places.

As in the first embodiment and the first to eighth variations thereof, the piezoelectric thin film resonator may be a solid mounted resonator (SMR) having the acoustic mirror 31 overlapping with the resonance region 50. As in the ninth variation of the first embodiment, the piezoelectric thin film resonator may be a film bulk acoustic resonator (FBAR) having the air gap 30 overlapping with the resonance region 50.

The example where the planar shape of the resonance region 50 is substantially rectangular has been described, but the planar shape of the resonance region 50 may be substantially elliptical, substantially circular, or substantially polygonal. It is sufficient if the additional films 28a and 28b are provided in at least a part of the region surrounding the center region 54. The center region 54 is the region including the center (for example, the center of gravity) of the resonance region 50.

Second Embodiment

Figure 13:
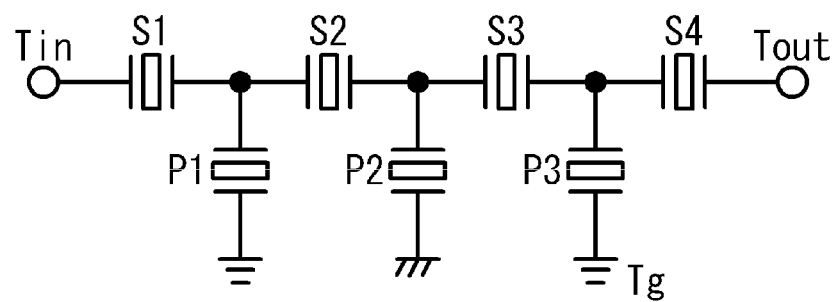
FIG. 13 is a circuit diagram of a filter in accordance with a second embodiment.

A second embodiment is an exemplary filter including the piezoelectric thin film resonator in accordance with any one of the first embodiment and the variations thereof. FIG. 13 is a circuit diagram of a filter in accordance with the second embodiment. As illustrated in FIG. 13, in a ladder-type filter, one or more series resonators S1 to S4 are provided in the path between an input terminal Tin and an output terminal Tout. First ends of one or more parallel resonators P1 to P3 are connected to the path between the input terminal Tin and the output terminal Tout, and second ends of the one or more parallel resonators P1 to P3 are grounded (are connected to the ground terminal Tg). The number of resonators in the ladder-type filter and the like can be freely selected.

Figure 14A:
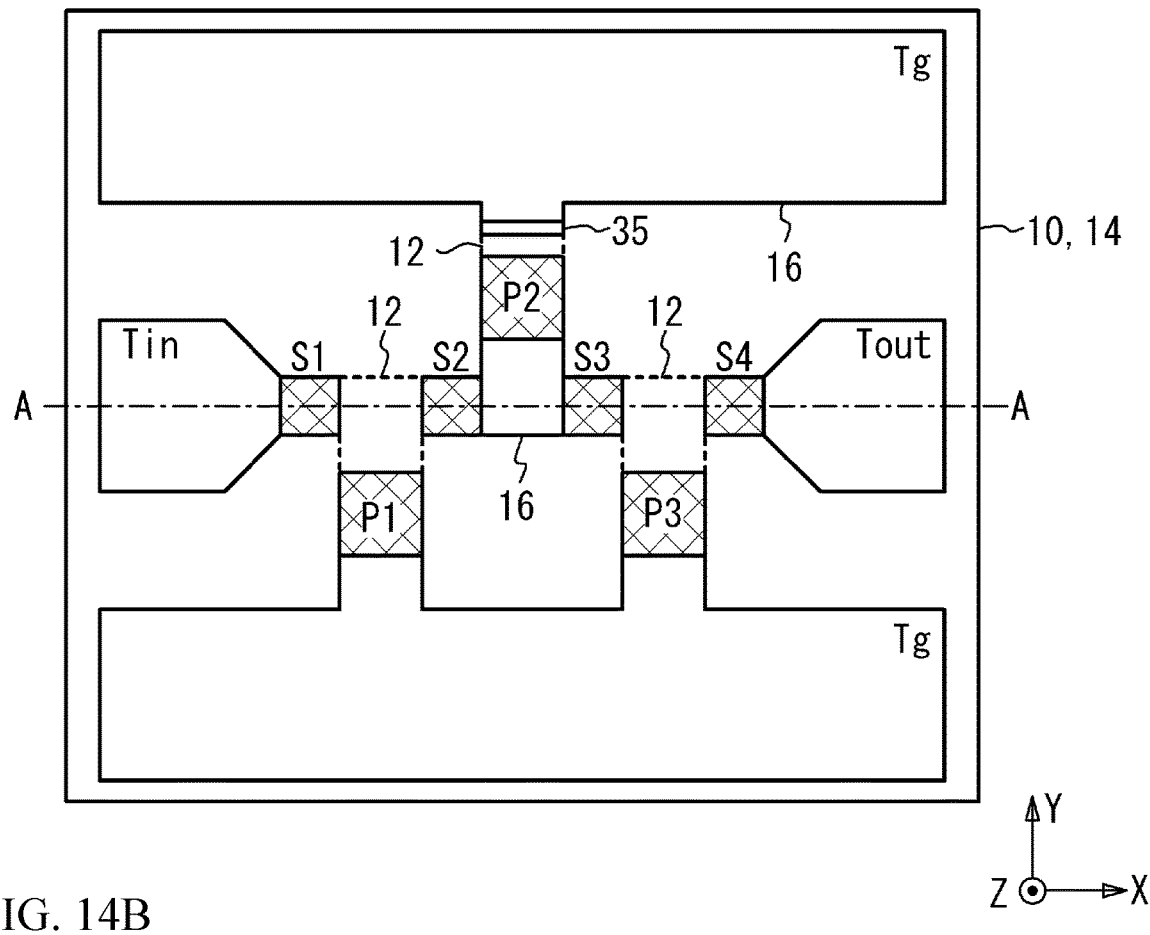
FIG. 14A is a plan view of a filter in accordance with a second embodiment.
Figure 14B:
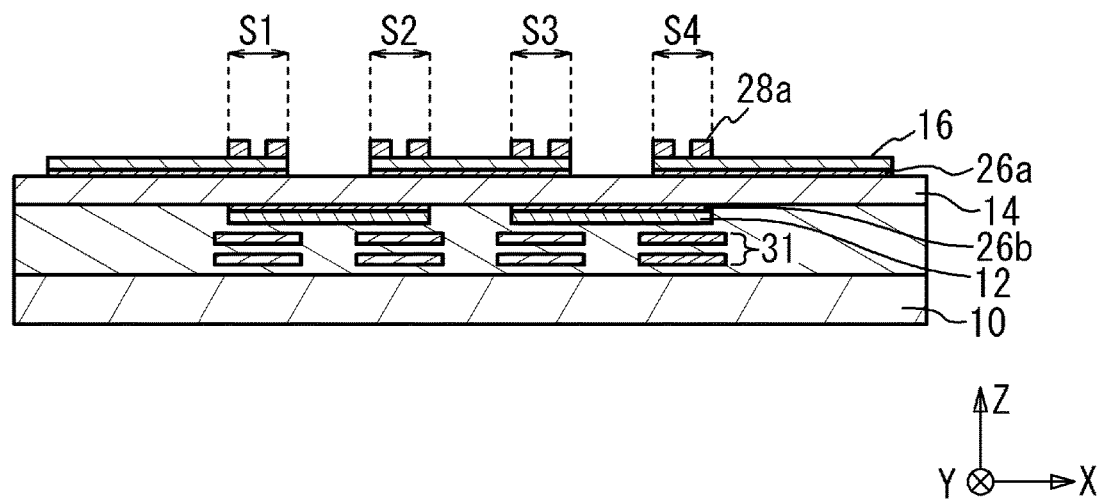
FIG. 14B is a cross-sectional view taken along line A-A in FIG. 14A.

FIG. 14A is a plan view of the filter in accordance with the second embodiment, and FIG. 14B is a cross-sectional view taken along line A-A in FIG. 14A. As illustrated in FIG. 14A, the lower electrode 12 is indicated by a dashed line, while the upper electrode 16 is indicated by a solid line.

As illustrated in FIG. 14A and FIG. 14B, the series resonators S1 to S4 and the parallel resonators P1 to P3 share the single piezoelectric layer 14. The lower electrode 12 and the upper electrode 16 are used as wiring lines connecting the resonators. To form the input terminal Tin, the output terminal Tout, and the ground terminal Tg using the upper electrode 16, a connection part 35 connecting the lower electrode 12 to the upper electrode 16 is provided as appropriate. Other structures are the same as those of the first embodiment illustrated in FIG. 1A and FIG. 1B.

As in the second embodiment, any one of the piezoelectric thin film resonators of the first embodiment and the variations thereof may be used as the series resonators S1 to S4 and the parallel resonators P1 to P3. This enables to adjust the electromechanical coupling coefficient.

Figure 15A:
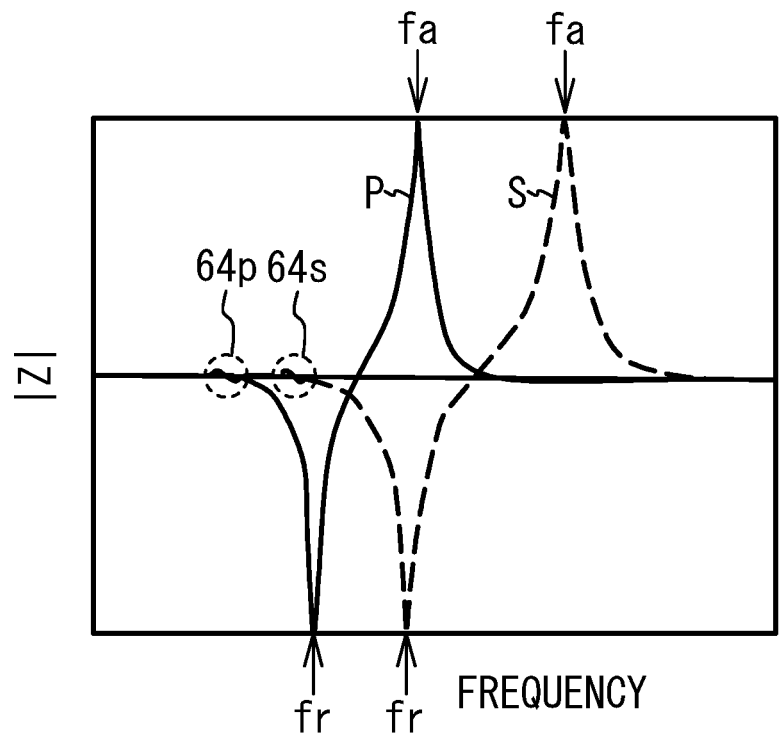
FIG. 15A is a graph of the absolute value of impedance versus frequency in a series resonator S and a parallel resonator P of a ladder-type filter.
Figure 15B:
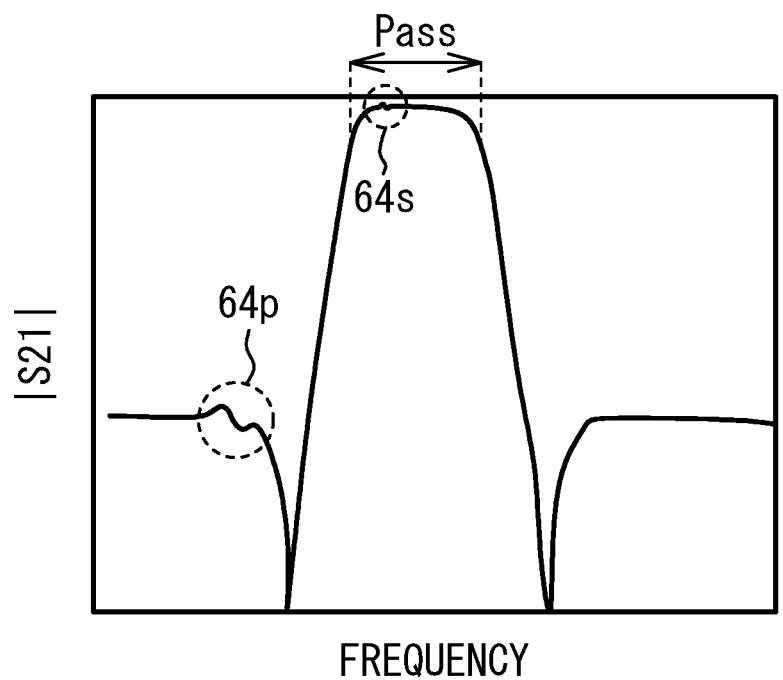
FIG. 15B is a graph of the attenuation |S21| of the ladder-type filter versus frequency.

FIG. 15A is a graph of the absolute value |Z| of impedance versus frequency in the series resonator S and the parallel resonator P of the ladder-type filter, and FIG. 15B is a graph of the attenuation |S21| of the ladder-type filter versus frequency.

As illustrated in FIG. 15A, when the additional films 26a and 26b are provided to the series resonator S and the parallel resonator P, spurious emissions 64s and 64p are generated at frequencies lower than the resonant frequency fr.

As illustrated in FIG. 15B, in the transmission characteristic of the ladder-type filter, the spurious emission 64p of the parallel resonator P is formed in the attenuation range lower than the passband Pass. Thus, the spurious emission 64p affects little on the transmission characteristic of the ladder-type filter. The spurious emission 64s of the series resonator S is formed within the passband Pass. Thus, a ripple is formed within the passband Pass.

First Variation of the Second Embodiment

Figure 16A:
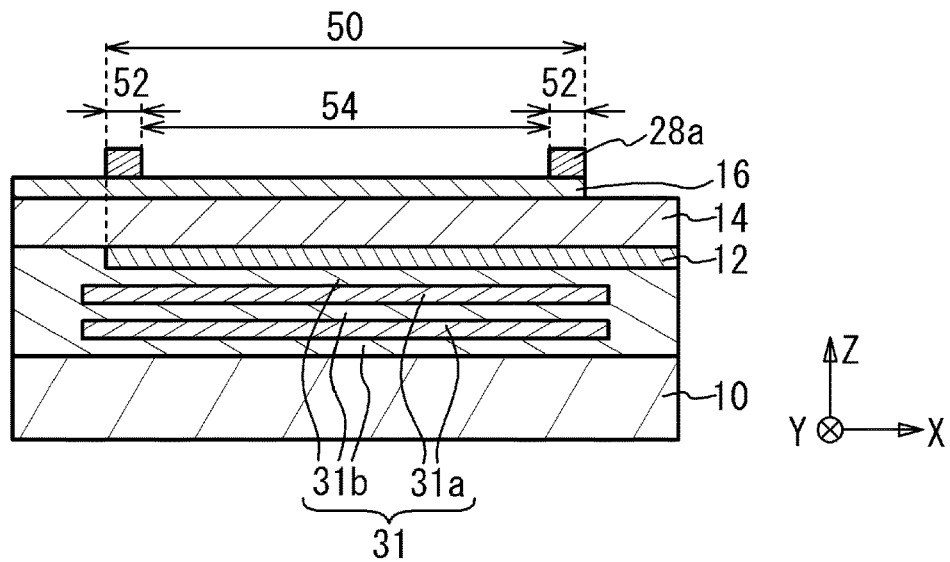
FIG. 16A and FIG. 16B are cross-sectional views of series resonators in first and second variations of the second embodiment, respectively.
Figure 16B:
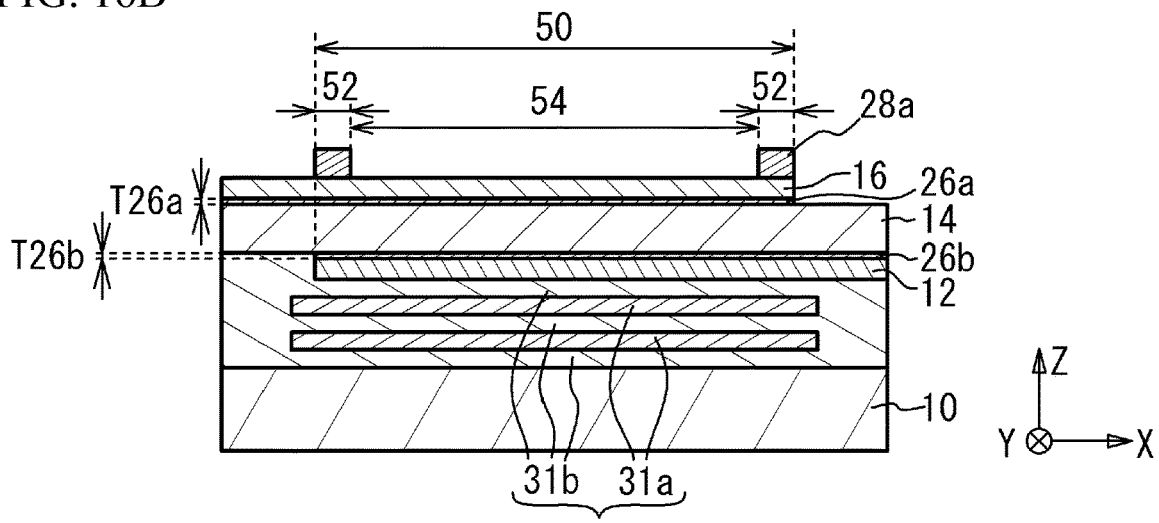
Figure 16C:
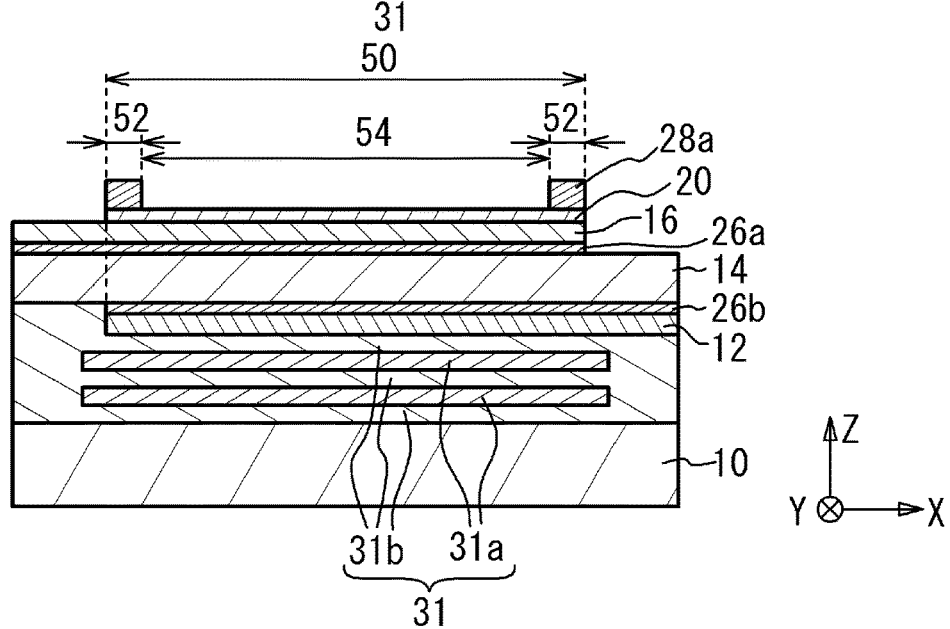
FIG. 16C is a cross-sectional view of the parallel resonator in the first and second variations of the second embodiment.

FIG. 16A and FIG. 16B are cross-sectional views of series resonators in first and second variations of the second embodiment, respectively. FIG. 16C is a cross-sectional view of a parallel resonator in the first and second variations of the second embodiment. As illustrated in FIG. 16A, neither the additional film 26a nor 26b is provided to the series resonator.

As illustrated in FIG. 16C, in the parallel resonator, a frequency adjusting film 20 is provided in the resonance region 50 on the upper surface of the upper electrode 16. The frequency adjusting film 20 is a film for adjusting the resonant frequency of the parallel resonator to be lower than the resonant frequency of the series resonator. To adjust the resonant frequency, the frequency adjusting film 20 has a higher density than the additional films 26a and 26b. For example, when the additional films 26a and 26b are mainly made of aluminum, the frequency adjusting film 20 is mainly made of, for example, titanium, ruthenium, chrome, copper, molybdenum, tungsten, tantalum, platinum, rhodium, or iridium. The frequency adjusting film 20 may be provided between the upper electrode 16 and the piezoelectric layer 14, between the lower electrode 12 and the piezoelectric layer 14, on the upper electrode 16, inside the upper electrode 16, under the lower electrode 12, inside the lower electrode 12, or at any of combinations of these places, for example, as long as the provision provides the frequency adjusting effects.

As illustrated in FIG. 16C, in the first variation of the second embodiment, one or some of the resonators of the filter are piezoelectric thin film resonators of any one of the first embodiment and the variations thereof (a first resonator), and further includes the frequency adjusting film 20 within the resonance region 50. The remaining resonators share the piezoelectric layer 14 with the first resonator as illustrated in FIG. 14A and FIG. 14B, and are configured to be the piezoelectric thin film resonators having no additional films 26a and 26b and no frequency adjusting film 20 (a second resonator) as illustrated in FIG. 16A. Accordingly, the influence of the spurious emission 64 on the filter characteristic is reduced by configuring the resonator of which the filter characteristic is affected by the spurious emission 64 to be the second resonator. Furthermore, the electromechanical coupling coefficient can be adjusted by configuring the resonator of which the filter characteristic is affected little by the spurious emission 64 to be the first resonator. The structure where the first resonator and the second resonator share the single piezoelectric layer 14 includes a structure where the first resonator and the second resonator share the single piezoelectric layer 14 as illustrated in FIG. 14A and FIG. 14B, and a structure obtained by forming the lower electrode 12 and the upper electrode 16 sharing the single piezoelectric layer 14 to form the first resonator and the second resonator and then forming a groove in the single piezoelectric layer 14 to separate the piezoelectric layer of the first resonator and the piezoelectric layer of the second resonator.

Second Variation of the Second Embodiment

As illustrated in FIG. 16B, the total thickness T26a+T26b of the additional films 26a and 26b of the series resonator is adjusted to be less than the total thickness of the additional films 26a and 26b of the parallel resonator in FIG. 16C.

As in the second variation of the second embodiment, the first resonator and the second resonator are both the piezoelectric thin film resonators of any one of the first embodiment and the variations thereof. The total thickness T26a+T26b of one or more additional films 26a and 26b of the second resonator is adjusted to be less than the total thickness T26a+T26b of one or more additional films 26a and 26b of the first resonator. This configuration reduces the influence of the spurious emission 64 on the filter characteristic by configuring the resonator of which the filter characteristic is affected by the spurious emission 64 to be the second resonator. Furthermore, the electromechanical coupling coefficient can be adjusted by configuring the resonator of which the filter characteristic is affected little by the spurious emission 64 to be the first resonator.

As in the first and the second variations of the second embodiment, the parallel resonator is configured to be the first resonator, and the series resonator is configured to be the second resonator. This configuration reduces the spurious emissions 64s in the series resonator formed within the passband Pass. The electromechanical coupling coefficient of the parallel resonator can be adjusted.

Figure 17:
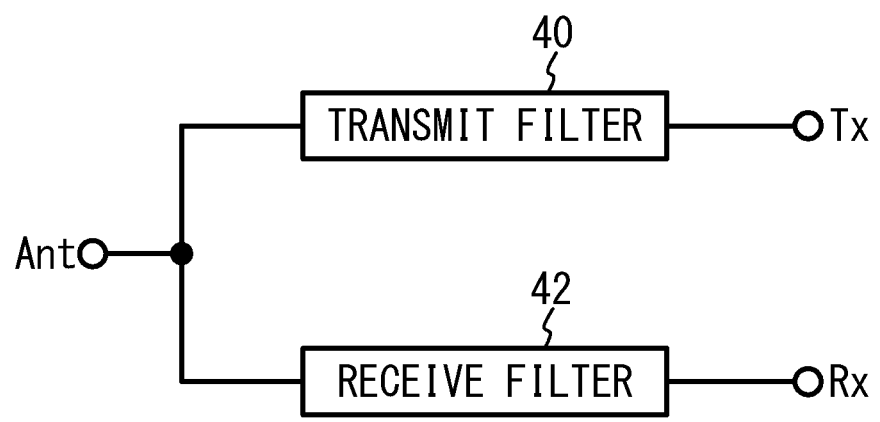
FIG. 17 is a circuit diagram of a duplexer in accordance with a third variation of the second embodiment.

FIG. 17 is a circuit diagram of a duplexer in accordance with a third variation of the second embodiment. As illustrated in FIG. 17, a transmit filter 40 is connected between a common terminal Ant and a transmit terminal Tx. A receive filter 42 is connected between a common terminal Ant and the receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 or the receive filter 42 may be the filter of any one of the second embodiment and the variations thereof.

A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
   a piezoelectric layer having an upper surface and a lower surface, the piezoelectric layer being a rotated Y-cut lithium niobate substrate or an X-cut lithium tantalate substrate;
   an upper conductive layer having a substantially consistent density, on or over the upper surface of the piezoelectric layer;
   a lower conductive layer having a substantially consistent density, on or below the lower surface of the piezoelectric layer, a region where the upper conductive layer faces the lower conductive layer across the piezoelectric layer in a plan view defining a resonance region;
   a first additional film having a substantially consistent density, disposed in at least one of the following locations: between the upper conductive layer and the piezoelectric layer, between the lower conductive layer and the piezoelectric layer, on an upper surface of the upper conductive layer, within the upper conductive layer as inserted therein, on a lower surface of the lower conductive layer, and within the lower conductive layer as inserted therein; and a second additional film, above or below the piezoelectric layer, in each of one or more of lateral edges of the resonance region, imparting an additional mass to the upper conductive layer or the lower conductive layer, the second additional film being absent in a central area of the resonance region other than said one or more of the lateral edges, wherein at least one of the upper and lower conductive layers is mainly made of ruthenium, chrome, copper, molybdenum, tungsten, tantalum, platinum, rhodium, or iridium, and wherein at least a part of the first additional film is in the resonance region in the plan view, and the density of the first additional film is equal to or less than the density of aluminum.

2. The acoustic wave device according to claim 1, wherein the first additional film is provided singly or in a plurality, and a thickness of the first additional film in case of the single first additional film or a total thickness of the first additional films in case of the plurality is greater than 0 and is equal to or less than 0.18 times a thickness of the piezoelectric layer.

3. The acoustic wave device according to claim 1, wherein the first additional film is mainly made of aluminum.

4. The acoustic wave device according to claim 1, wherein the first additional film is an insulating film having a relative permittivity less than a relative permittivity of the piezoelectric layer.

5. The acoustic wave device according to claim 1, wherein the at least one of the upper and lower conductive layers contains 80 atomic % or greater of ruthenium, chrome, copper, molybdenum, tungsten, tantalum, platinum, rhodium, or iridium.

6. An acoustic wave device comprising:

a piezoelectric layer having an upper surface and a lower surface, the piezoelectric layer being a rotated Y-cut lithium niobate substrate or an X-cut lithium tantalate substrate;

an upper conductive layer having a substantially consistent density, on or over the upper surface of the piezoelectric layer;

a lower conductive layer having a substantially consistent density, on or below the lower surface of the piezoelectric layer, a region where the upper conductive layer faces the lower conductive layer across the piezoelectric layer in a plan view defining a resonance region, at least one of the upper and lower conductive layers being mainly made of aluminum;

a first additional film having a substantially consistent density, disposed in at least one of the following locations: between the upper conductive layer and the piezoelectric layer, between the lower conductive layer and the piezoelectric layer, on an upper surface of the upper conductive layer, within the upper conductive layer as inserted therein, on a lower surface of the lower conductive layer, and within the lower conductive layer as inserted therein; and a second additional film, above or below the piezoelectric layer, in each of one or more of lateral edges of the resonance region, imparting an additional mass to the upper conductive layer or the lower conductive layer, the second additional film being absent in a central area of the resonance region other than said one or more of the lateral edges, wherein at least a part of the first additional film is in the resonance region in the plan view, and the first additional film is mainly made of silicon oxide.

7. The acoustic wave device according to claim 6, wherein the at least one of the upper and lower conductive layers contains 80 atomic % or greater of aluminum.

8. The acoustic wave device according to claim 6, wherein a sum of the concentration of oxygen and the concentration of silicon in the first additional film is 80 atomic % or greater.

9. The acoustic wave device according to claim 6, wherein the first additional film is provided singly or in a plurality, and a thickness of the first additional film in case of the single first additional film or a total thickness of the first additional films in case of the plurality is greater than 0 and is equal to or less than 0.18 times a thickness of the piezoelectric layer.

10. A filter comprising:

a first resonator including:

a first piezoelectric layer having an upper surface and a lower surface, the first piezoelectric layer being a rotated Y-cut lithium niobate substrate or an X-cut lithium tantalate substrate, a first upper conductive layer having a substantially consistent density, on or over the upper surface of the first piezoelectric layer, a first lower conductive layer having a substantially consistent density, on or below the lower surface of the first piezoelectric layer, a region where the first upper conductive layer faces the first lower conductive layer across the first piezoelectric layer in a plan view defining a resonance region, an additional film having a substantially consistent density, disposed in at least one of the following locations: between the first upper conductive layer and the first piezoelectric layer, between the first lower conductive layer and the first piezoelectric layer, on an upper surface of the first upper conductive layer, within the first upper conductive layer as inserted therein, on a lower surface of the first lower conductive layer, and within the first lower conductive layer as inserted therein, and a frequency adjusting film having a density greater the density of the additional film in the resonance region, wherein at least one of the first upper and first lower conductive layers is mainly made of ruthenium, chrome, copper, molybdenum, tungsten, tantalum, platinum, rhodium, or iridium, and wherein at least a part of the additional film is in the resonance region in the plan view, and the density of the additional film is equal to or less than the density of aluminum; and a second resonator including a second upper conductive layer and a second lower conductive layer sandwiching a second piezoelectric layer therebetween, the second piezoelectric layer being a rotated Y-cut lithium niobate substrate or an X-cut lithium tantalate substrate, no additional film and no frequency adjusting film being disposed in any of the following locations in the second resonator: between the second upper conductive layer and the second piezoelectric layer, between the second lower conductive layer and the second piezoelectric layer, on an upper surface of the second upper conductive layer, within the second upper conductive layer, on a lower surface of the second lower conductive layer, and within the second lower conductive layer.

11. The filter according to claim 10, further comprising:
an input terminal;
an output terminal;

one or more series resonators provided in a path connecting the input terminal to the output terminal, each of the one or more series resonators being the second resonator; and a parallel resonator having a first end that is connected to the path and a second end that is grounded, the parallel resonator being the first resonator.

12. A filter comprising:

a first resonator including:
- a first piezoelectric layer having an upper surface and a lower surface, the first piezoelectric layer being a rotated Y-cut lithium niobate substrate or an X-cut lithium tantalate substrate,
- a first upper conductive layer having a substantially consistent density, on or over the upper surface of the first piezoelectric layer,
- a first lower conductive layer having a substantially consistent density, on or below the lower surface of the first piezoelectric layer, a region where the first upper conductive layer faces the first lower conductive layer across the first piezoelectric layer in a plan view defining a first resonance region, and
- a first additional film having a substantially consistent density, disposed in at least one of the following locations: between the first upper conductive layer and the first piezoelectric layer, between the first lower conductive layer and the first piezoelectric layer, on an upper surface of the first upper conductive layer, within the first upper conductive layer as inserted therein, on a lower surface of the first lower conductive layer, and within the first lower conductive layer as inserted therein,
- wherein at least one of the first upper and first lower conductive layers is mainly made of ruthenium, chrome, copper, molybdenum, tungsten, tantalum, platinum, rhodium, or iridium, and
- wherein at least a part of the first additional film is in the first resonance region in the plan view, and the density of the first additional film is equal to or less than the density of aluminum; and a second resonator including:
- a second piezoelectric layer having an upper surface and a lower surface, the second piezoelectric layer being a rotated Y-cut lithium niobate substrate or an X-cut lithium tantalate substrate,
- a second upper conductive layer having a substantially consistent density, on or over the upper surface of the second piezoelectric layer,
- a second lower conductive layer having a substantially consistent density, on or below the lower surface of the second piezoelectric layer, a region where the second upper conductive layer faces the second lower conductive layer across the second piezoelectric layer in a plan view defining a second resonance region and
- a second additional film having a substantially consistent density, disposed in at least one of the following locations: between the second upper conductive layer and the second piezoelectric layer, between the second lower conductive layer and the second piezoelectric layer, on an upper surface of the second upper conductive layer, within the second upper conductive layer as inserted therein, on a lower surface of the second lower conductive layer, and within the second lower conductive layer as inserted therein,
- wherein at least one of the second upper and second lower conductive layers is mainly made of ruthenium, chrome, copper, molybdenum, tungsten, tantalum, platinum, rhodium, or iridium, and
- wherein at least a part of the second additional film is in the second resonance region in the plan view, and the density of the second additional film is equal to or less than the density of aluminum, wherein the first additional film in the first resonator is provided singly or in a plurality, and the second additional film in the second resonator is provided singly or in a plurality, and wherein a total thickness of the second additional film in the second resonator is less than a total thickness of the first additional film in the first resonator.

13. The filter according to claim 12, further comprising:

an input terminal;

an output terminal;

one or more series resonators provided in a path connecting the input terminal to the output terminal, each of the one or more series resonators being the second resonator; and a parallel resonator having a first end that is connected to the path and a second end that is grounded, the parallel resonator being the first resonator.

14. A filter comprising:

a first resonator including:
- a first piezoelectric layer having an upper surface and a lower surface, the first piezoelectric layer being a rotated Y-cut lithium niobate substrate or an X-cut lithium tantalate substrate,
- a first upper conductive layer having a substantially consistent density, on or over the upper surface of the first piezoelectric layer,
- a first lower conductive layer having a substantially consistent density, on or below the lower surface of the first piezoelectric layer, a region where the first upper conductive layer faces the first lower conductive layer across the first piezoelectric layer in a plan view defining a first resonance region, at least one of the first upper and first lower conductive layers being mainly made of aluminum, and
- a first additional film having a substantially consistent density, disposed in at least one of the following locations: between the first upper conductive layer and the first piezoelectric layer, between the first lower conductive layer and the first piezoelectric layer, on an upper surface of the first upper conductive layer, within the first upper conductive layer as inserted therein, on a lower surface of the first lower conductive layer, and within the first lower conductive layer as inserted therein,
- wherein at least a part of the first additional film is in the first resonance region in the plan view, and the first additional film is mainly made of silicon oxide; and a second resonator including:
- a second piezoelectric layer having an upper surface and a lower surface, the second piezoelectric layer being a rotated Y-cut lithium niobate substrate or an X-cut lithium tantalate substrate,
- a second upper conductive layer having a substantially consistent density, on or over the upper surface of the second piezoelectric layer,
- a second lower conductive layer having a substantially consistent density, on or below the lower surface of the second piezoelectric layer, a region where the second upper conductive layer faces the second lower conductive layer across the second piezoelectric layer in a plan view defining a second resonance region, at least one of the second upper and second lower conductive layers being mainly made of aluminum, and a second additional film having a substantially consistent density, disposed in at least one of the following locations: between the second upper conductive layer and the second piezoelectric layer, between the second lower conductive layer and the second piezoelectric layer, on an upper surface of the second upper conductive layer, within the second upper conductive layer as inserted therein, on a lower surface of the second lower conductive layer, and within the second lower conductive layer as inserted therein, wherein at least a part of the second additional film is in the second resonance region in the plan view, and the second additional film is mainly made of silicon oxide, wherein the first additional film in the first resonator is provided singly or in a plurality, and the second additional film in the second resonator is provided singly or in a plurality, and wherein a total thickness of the second additional film in the second resonator is less than a total thickness of the first additional film in the first resonator.

15. The filter according to claim 14, further comprising:
an input terminal;
an output terminal;
one or more series resonators provided in a path connecting the input terminal to the output terminal, each of the one or more series resonators being the second resonator; and
a parallel resonator having a first end that is connected to the path and a second end that is grounded, the parallel resonator being the first resonator.

16. A filter comprising:
a first resonator including:
  a first piezoelectric layer having an upper surface and a lower surface, the first piezoelectric layer being a rotated Y-cut lithium niobate substrate or an X-cut lithium tantalate substrate,
  a first upper conductive layer having a substantially consistent density, on or over the upper surface of the first piezoelectric layer,
  a first lower conductive layer having a substantially consistent density, on or below the lower surface of the first piezoelectric layer, a region where the first upper conductive layer faces the first lower conductive layer across the first piezoelectric layer in a plan view defining a resonance region, at least one of the first upper and first lower conductive layers being mainly made of aluminum,
  an additional film having a substantially consistent density, disposed in at least one of the following locations: between the first upper conductive layer and the first piezoelectric layer, between the first lower conductive layer and the first piezoelectric layer, on an upper surface of the first upper conductive layer, within the first upper conductive layer as inserted therein, on a lower surface of the first lower conductive layer, and within the first lower conductive layer as inserted therein, and
  a frequency adjusting film having a density greater the density that of the additional film in the resonance region,
  wherein at least a part of the additional film is in the resonance region in the plan view, and the additional film is mainly made of silicon oxide; and
a second resonator including a second upper conductive layer and a second lower conductive layer sandwiching a second piezoelectric layer therebetween, the second piezoelectric layer being a rotated Y-cut lithium niobate substrate or an X-cut lithium tantalate substrate, no additional film and no frequency adjusting film being disposed in any of the following locations in the second resonator: between the second upper conductive layer and the second piezoelectric layer, between the second lower conductive layer and the second piezoelectric layer, on an upper surface of the second upper conductive layer, within the second upper conductive layer, on a lower surface of the second lower conductive layer, and within the second lower conductive layer.

17. The filter according to claim 16, further comprising:
an input terminal;
an output terminal;
one or more series resonators provided in a path connecting the input terminal to the output terminal, each of the one or more series resonators being the second resonator; and
a parallel resonator having a first end that is connected to the path and a second end that is grounded, the parallel resonator being the first resonator.

* * * * *